US012721187B2

(12) United States Patent
Fujii et al.

(10) Patent No.: US 12,721,187 B2
(45) Date of Patent: Aug. 25, 2026

(54) SEMICONDUCTOR DEVICE

(71) Applicant: ROHM CO., LTD., Kyoto (JP)

(72) Inventors: Kenji Fujii, Kyoto (JP); Taro Nishioka, Kyoto (JP); Shinya Hikita, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 518 days.

(21) Appl. No.: 18/351,253

(22) Filed: Jul. 12, 2023

(65) Prior Publication Data

US 2023/0361007 A1 Nov. 9, 2023

Related U.S. Application Data

(63) Continuation of application No. PCT/JP2021/047504, filed on Dec. 22, 2021.

(30) Foreign Application Priority Data

Jan. 15, 2021 (JP) ................................ 2021-004766

(51) Int. Cl.
*H10W 70/40* (2026.01)
*H10W 74/10* (2026.01)

(52) U.S. Cl.
CPC ....... *H10W 70/424* (2026.01); *H10W 70/415* (2026.01); *H10W 74/114* (2026.01)

(58) Field of Classification Search
CPC .................................................. H01L 23/4951
See application file for complete search history.

(56) References Cited

U.S. PATENT DOCUMENTS 8,338,927 B2 * 12/2012 Nakamura .......... H10W 70/045 257/676
8,853,865 B2 * 10/2014 Narita ................ H10W 70/415 257/778

(Continued)

FOREIGN PATENT DOCUMENTS

JP 2019-095317 6/2019
JP 2020-077694 5/2020

OTHER PUBLICATIONS

Office Action issued in corresponding Japanese Patent Application No. 2022-575169, Aug. 12, 2025, 4 pages w/ translation.

(Continued)

*Primary Examiner* — Dale E Page
*Assistant Examiner* — Rohit Parthasarathy
(74) *Attorney, Agent, or Firm* — HSML P.C.

(57) ABSTRACT

A semiconductor device includes leads each having an obverse surface facing in a thickness direction and extending in a first direction crossing the thickness direction, a semiconductor element including electrodes connected to the obverse surfaces of the leads, and a sealing resin covering the leads and semiconductor element. The sealing resin includes a resin bottom surface opposite from the semiconductor element with respect to the leads in the thickness direction. The leads are mutually separated in a second direction orthogonal to the thickness direction and the first direction. Each lead includes a first reverse surface, a second reverse surface and a recessed surface facing away from the obverse surface in the thickness direction. The first and the second reverse surfaces are mutually separated with the recessed surface intervening in the first direction and exposed at the resin bottom surface. The recessed surface is covered with the sealing resin.

15 Claims, 19 Drawing Sheets

(56) References Cited

U.S. PATENT DOCUMENTS

| | | | | |
|---|---|---|---|---|
| 11,262,374 | B2 * | 3/2022 | Otsuki | G01P 1/023 |
| 12,166,002 | B2 * | 12/2024 | Futamura | H10W 70/424 |
| 2002/0158347 | A1 * | 10/2002 | Yagi | H10W 70/415 257/787 |
| 2009/0075469 | A1 * | 3/2009 | Furman | H05K 3/3436 438/613 |
| 2012/0180566 | A1 * | 7/2012 | Matsunaga | G01P 1/023 73/504.08 |
| 2013/0334662 | A1 * | 12/2013 | Jackson | G01R 19/0092 257/536 |
| 2015/0001704 | A1 * | 1/2015 | Lu | H10W 72/072 257/737 |
| 2015/0091143 | A1 * | 4/2015 | Fujii | H10W 90/811 257/666 |
| 2016/0027751 | A1 * | 1/2016 | Kim | H10W 72/20 257/737 |
| 2018/0102306 | A1 * | 4/2018 | Cho | H10W 70/481 |
| 2018/0342475 | A1 * | 11/2018 | Wirz | H10W 90/00 |
| 2019/0162745 | A1 * | 5/2019 | Otsuki | G01P 1/023 |
| 2020/0144211 | A1 * | 5/2020 | Fujii | H10W 70/481 |
| 2020/0312806 | A1 * | 10/2020 | Takei | H10W 70/421 |
| 2022/0115347 | A1 * | 4/2022 | Futamura | H10W 70/415 |
| 2022/0157758 | A1 * | 5/2022 | Futamura | H10W 70/424 |
| 2023/0080548 | A1 * | 3/2023 | Hikita | H10W 70/424 257/734 |
| 2023/0090494 | A1 * | 3/2023 | Fujii | H10W 70/421 257/666 |
| 2023/0110154 | A1 * | 4/2023 | Zhang | H10W 70/415 257/678 |
| 2023/0215825 | A1 * | 7/2023 | Takeoka | H10W 72/90 257/737 |
| 2023/0361006 | A1 * | 11/2023 | Yaginuma | H10W 70/417 |
| 2024/0379507 | A1 * | 11/2024 | Nii | H10W 70/421 |

OTHER PUBLICATIONS

Office Action issued in corresponding German Patent Application No. 112021006817.2, Aug. 27, 2025, 8 pages w/ informal translation.

International Search Report and Written Opinion issued in International Application No. PCT/JP2021/047504, Mar. 22, 2022, 4 pages.

* cited by examiner

A10
40
41
434
274(29)
27
10
20
207(23)
106(12)
26
263
432
x
y
z

A10
434
272(29)
274
273(28)
27
40
12
106
11
105
1
102
103
13
23
22
205
2
202
21
432
263
26
262
261
251
252
253
25
433
431
x
y

A20

SEMICONDUCTOR DEVICE

TECHNICAL FIELD

The present disclosure relates to a semiconductor device.

BACKGROUND ART

A QFN (Quad For Non-Lead Package) is known as a package type of a semiconductor device. JP-A-2020-77694 discloses an example of such a QFN-type semiconductor device.

The disclosed semiconductor device has a plurality of leads, and the end surface of each lead is exposed to be flush with the side surface of the sealing resin (package). The reverse surface of each lead is exposed to be flush with the bottom surface of the sealing resin. With such a configuration, the semiconductor device can be made compact and reduce the mounting area on a circuit board as compared with a QFP (Quad Flat Package) type, in which the leads protrude from the side surface of the sealing resin.

In the semiconductor device disclosed in JP-A-2020-77694, the leads support the semiconductor element. As shown in FIG. 4 of JP-A-2020-77694, the reverse surface 102 of each lead 10 is elongated in the direction x and located directly below the semiconductor element. Thus, the heat generated from the semiconductor element tends to concentrate on the area directly below the semiconductor element through the leads 10 to be dissipated through the area. This may cause unevenness in heat dissipation from the semiconductor device. The reverse surfaces 102 of the leads 10 are arranged side by side in the y direction. When such a semiconductor device is mounted to a circuit board, improper electrical conduction between adjacent reverse surfaces 102 (i.e., leads 10) can occur. To avoid such a failure, a large distance needs to be provided between adjacent reverse surfaces 102. This hinders size reduction of the semiconductor device.

DETAILED DESCRIPTION OF EMBODIMENTS

The following describes preferred embodiments of the present disclosure in detail with reference to the drawings.

In the present disclosure, the terms such as “first”, “second”, and “third” are used merely as labels and are not intended to impose ordinal requirements on the items to which these terms refer.

In the present disclosure, the phrases “an object A is formed in an object B” and “an object A is formed on an object B” include, unless otherwise specified, “an object A is formed directly in/on the object B” and “an object A is formed in/on the object B with another object interposed between the object A and the object B”. Similarly, the phrases “an object A is disposed in an object B” and “an object A is disposed on an object B” include, unless otherwise specified, “an object A is disposed directly in/on the object B” and “an object A is disposed in/on the object B with another object interposed between the object A and the object B”. Similarly, the phrase “an object A is located on an object B” includes, unless otherwise specified, “an object A is located on an object B in contact with the object B” and “an object A is located an object B with another object interposed between the object A and the object B”. Also, the phrase “an object A overlaps with an object B as viewed in a certain direction” includes, unless otherwise specified, “an object A overlaps with the entirety of an object B” and “an object A overlaps with a portion of an object B”.

Figure 1:
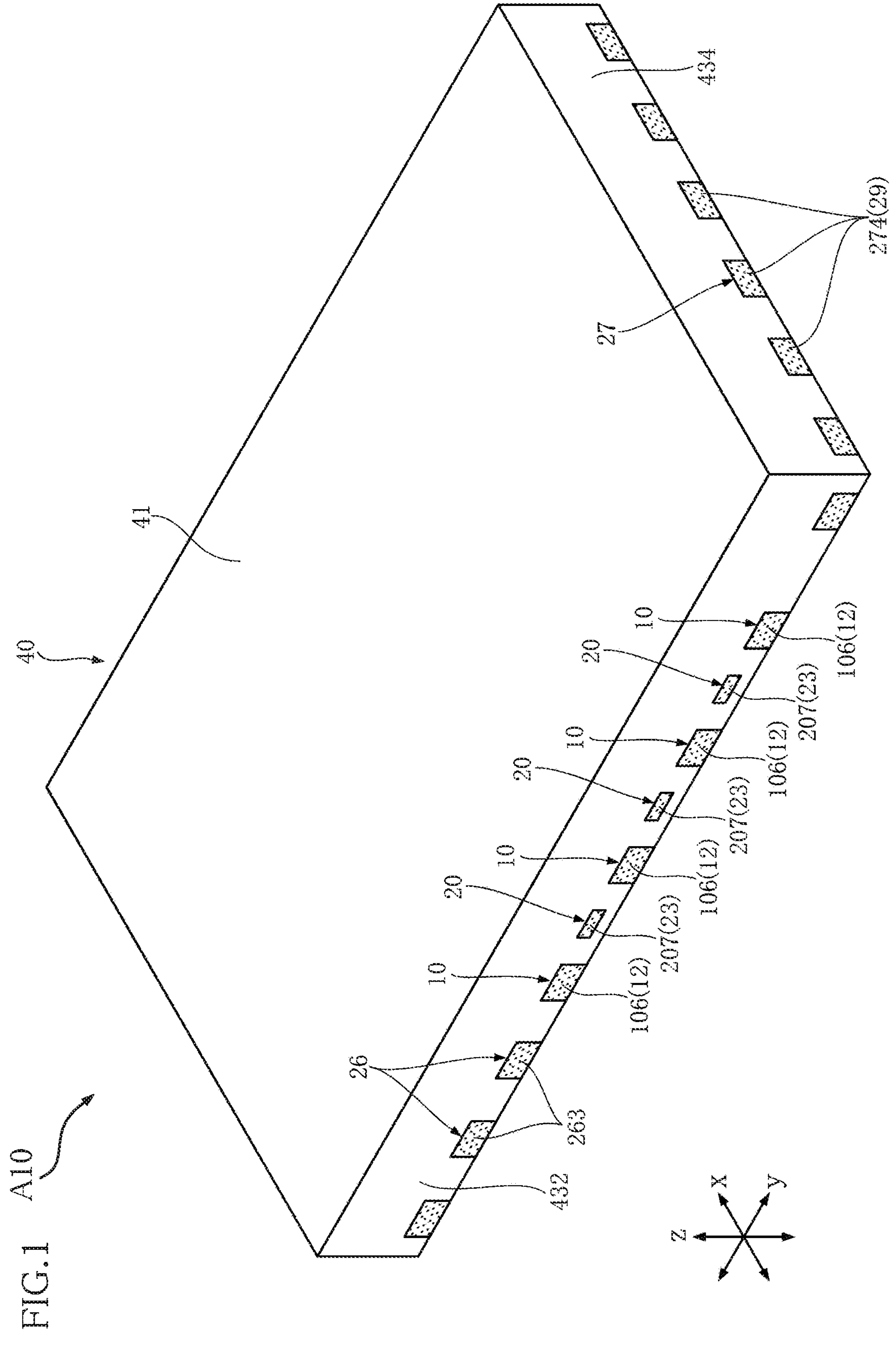
FIG. 1 is a perspective view of a semiconductor device according to a first embodiment of the present disclosure.

A semiconductor device A10 according to a first embodiment of the present disclosure is described below with reference to FIGS. 1 to 15. The semiconductor device A10 includes a plurality of first leads 10, a plurality of second leads 20, a plurality of third leads 25, a plurality of leads 26, a fourth lead 27, a semiconductor element 30 and a sealing resin 40. As shown in FIG. 1, the package type of the semiconductor device A10 is the QFN. The semiconductor element 30 is an LSI of a flip-chip type containing a switching circuit 321 and a control circuit 322. In the semiconductor device A10, DC power (voltage) is converted to AC power (voltage) by the switching circuit 321. The semiconductor device A10 may be used for an element of a DC/DC converter circuit, for example. For convenience of understanding, the sealing resin 40 is shown as transparent in FIG. 2, and the semiconductor element 30 and the sealing resin 40 are shown as transparent in FIG. 3. In these figures, the outlines of the semiconductor element 30 and the sealing resin 40 shown as transparent are indicated by imaginary lines (two-dot chain lines).

Figure 2:
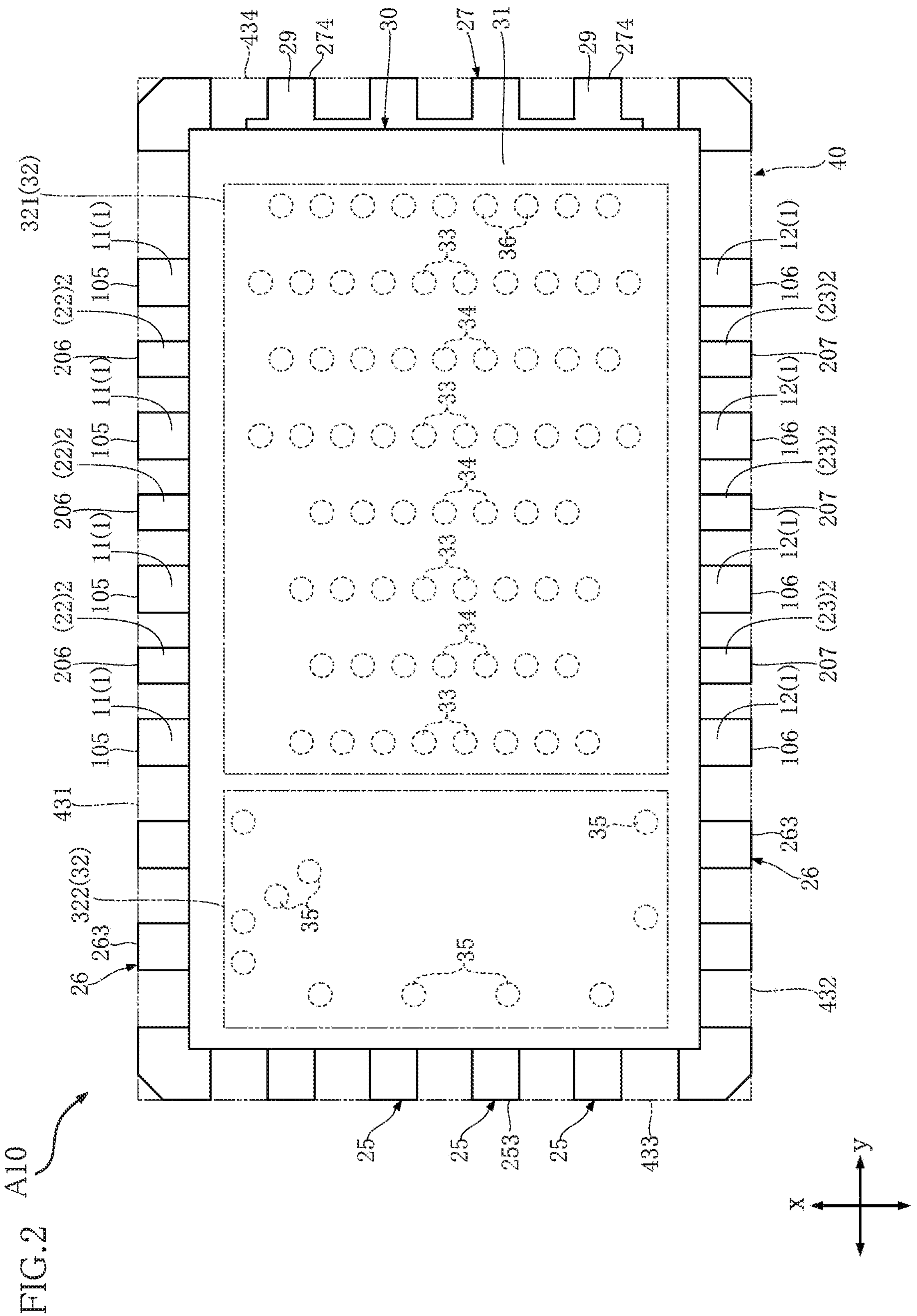
FIG. 2 is a plan view of the semiconductor device shown in FIG. 1 (as seen through a sealing resin).

In the description of the semiconductor device A10, the thickness direction of the first lead 10 is defined as a "thickness direction z". A direction orthogonal to the thickness direction z is defined as a "first direction x". The direction orthogonal to the thickness direction z and the first direction x is defined as a "second direction y". As shown in FIGS. 1 and 2, the semiconductor device A10 is rectangular as viewed in the thickness direction z (i.e., in plan view).

The first leads 10, the second leads 20, the third leads 25, the leads 26 and the fourth lead 27 support the semiconductor element 30 as shown in FIG. 2 and serve as the terminals for mounting the semiconductor device A10 to a circuit board. As shown in FIGS. 11 to 15, each of the first leads 10, second leads 20, third leads 25, leads 26 and fourth lead 27 is partially covered with the sealing resin 40. The first leads 10, the second leads 20, the third leads 25, the leads 26 and the fourth lead 27 are formed from a same lead frame. The constituent material of the lead frame may be copper (Cu) or a copper alloy, for example.

Figure 3:
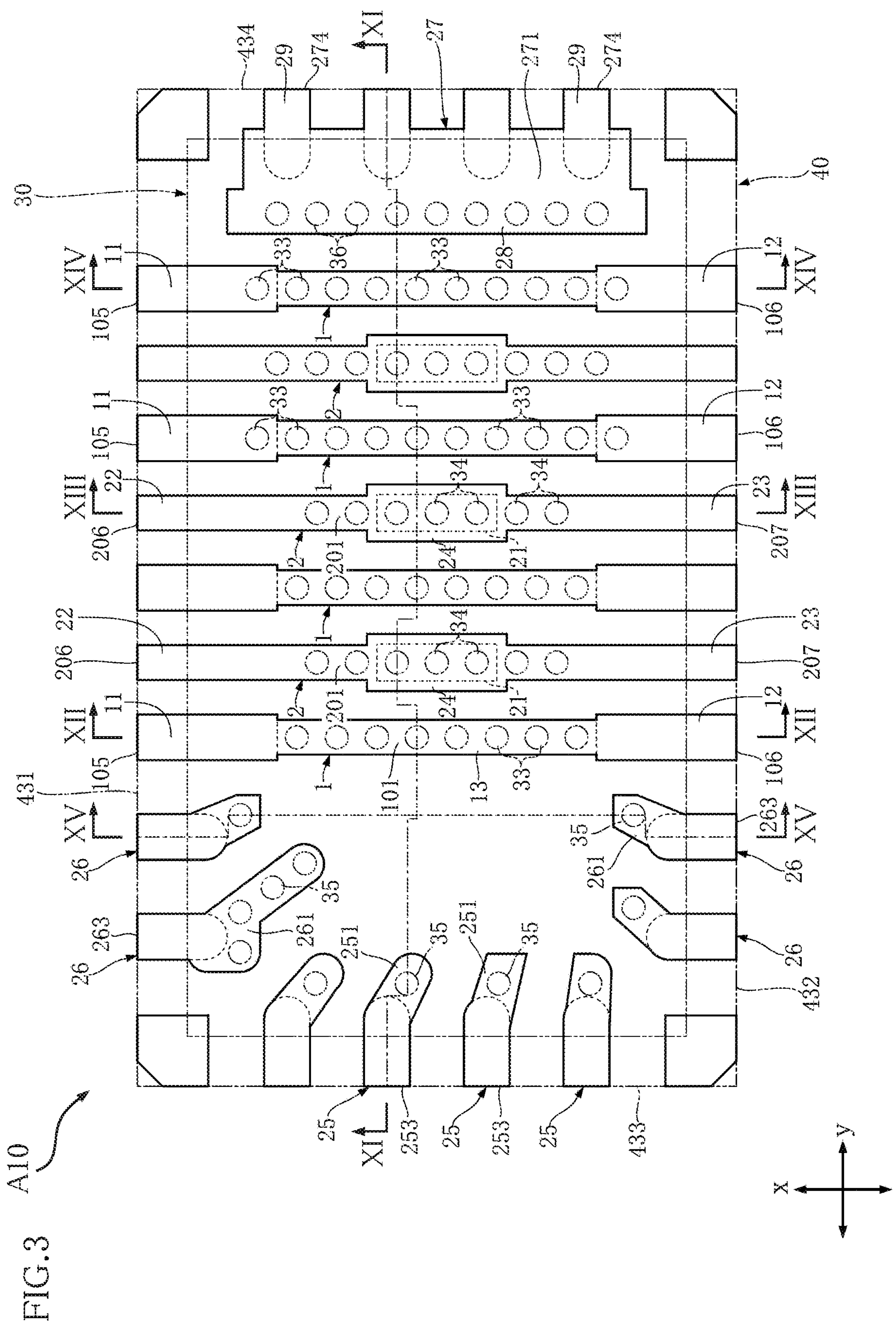
FIG. 3 is a plan view of the semiconductor device shown in FIG. 1 (as seen through a semiconductor element and the sealing resin).
Figure 4:
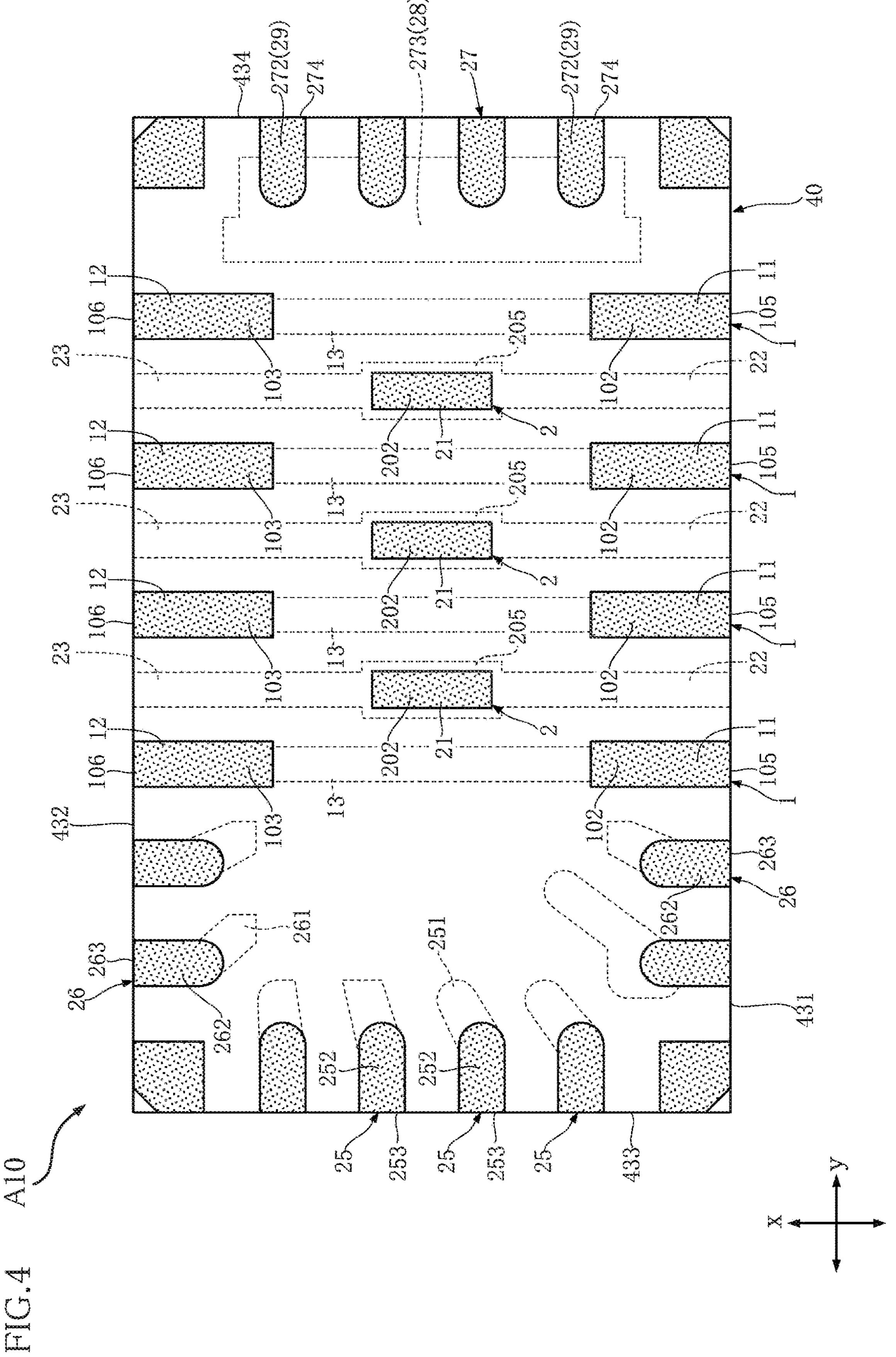
FIG. 4 is a bottom view of the semiconductor device shown in FIG. 1.

As shown in FIGS. 3 and 4, each of the first leads 10 extends in the first direction x. The first leads 10 are arranged at predetermined intervals in the second direction y. Each of the first leads 10 is an input terminal that receives DC power (voltage) to be converted in the semiconductor device A10. The first leads 10 are a positive electrode (P terminal).

Figure 11:
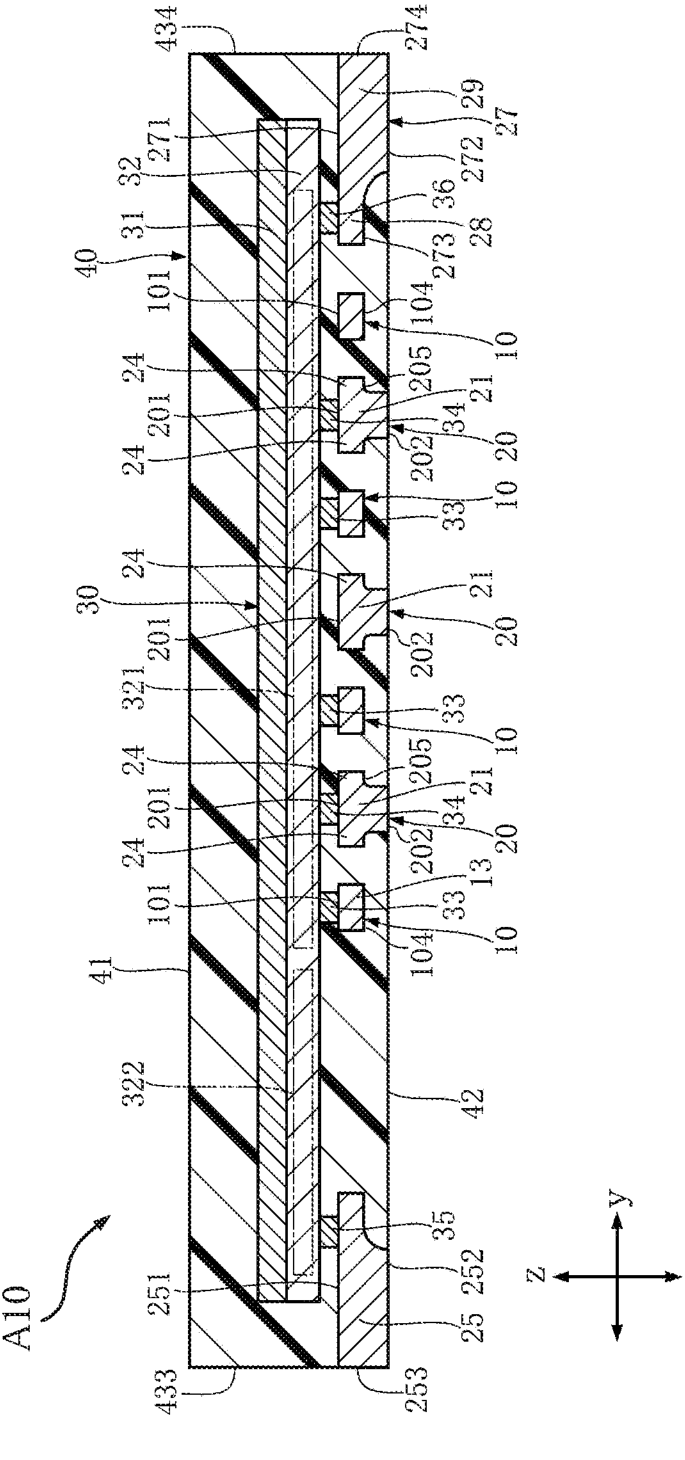
FIG. 11 is a sectional view taken along line XI-XI in FIG. 3.
Figure 12:
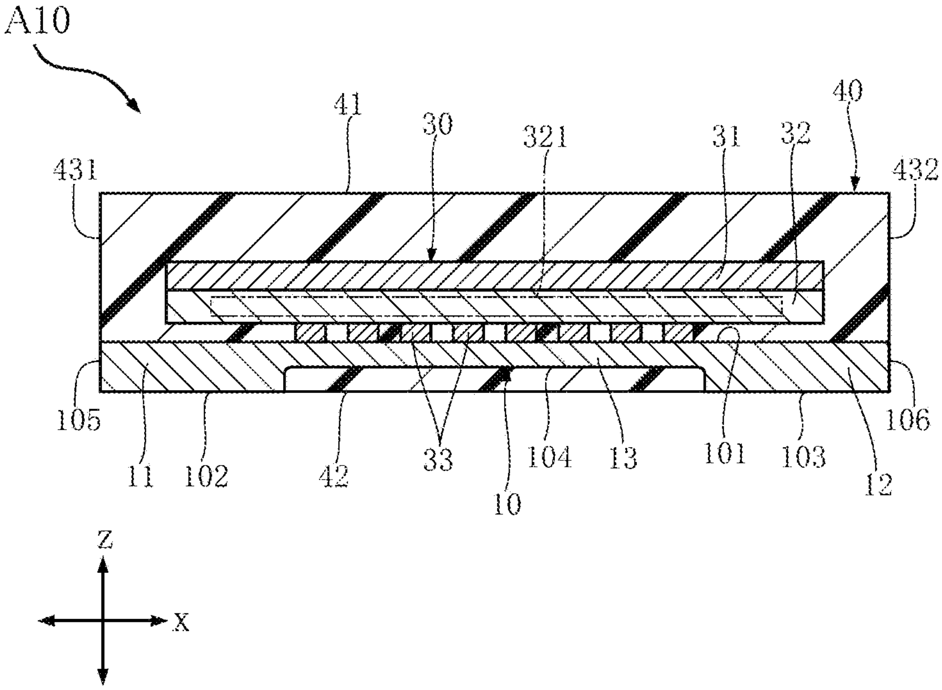
FIG. 12 is a sectional view taken along line XII-XII in FIG. 3.
Figure 14:
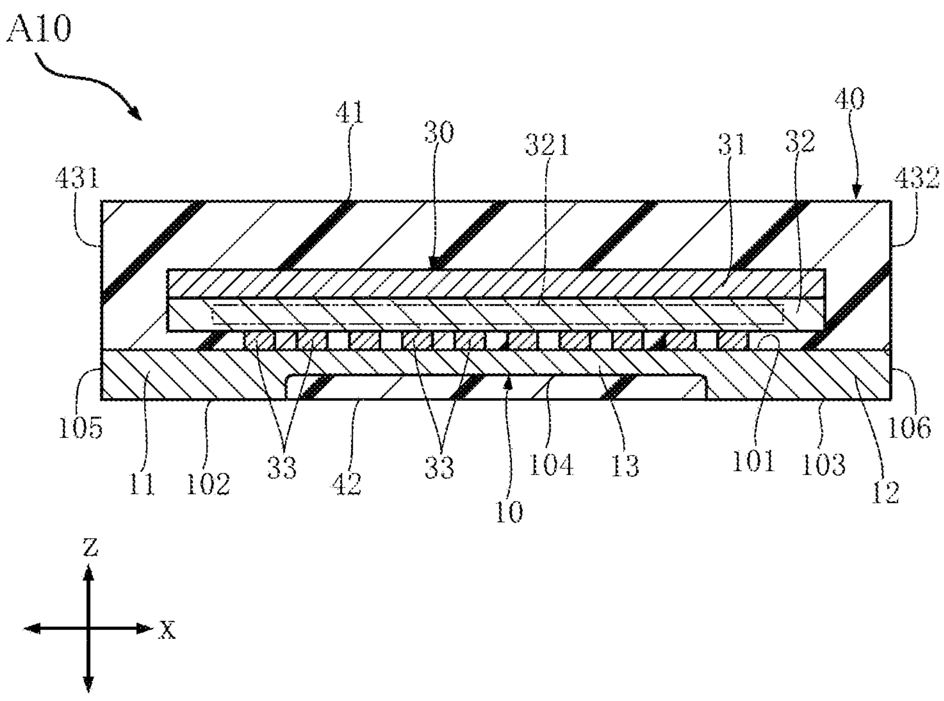
FIG. 14 is a sectional view taken along line XIV-XIV in FIG. 3.

As shown in FIGS. 11, 12 and 14, each of the first leads 10 has a first obverse surface 101, a first reverse surface 102, a second reverse surface 103, a first recessed surface 104, a first end surface 105 and a second end surface 106. The first obverse surface 101 faces a first side in the thickness direction z and is opposite to the semiconductor element 30. The first obverse surface 101 is covered with the sealing resin 40. The semiconductor element 30 is supported on the first obverse surface 101.

The first reverse surface 102, the second reverse surface 103 and the first recessed surface 104 face away from the first obverse surface 101 (i.e., face a second side in the thickness direction z). The first reverse surface 102 and the second reverse surface 103 are spaced apart from each other in the first direction x with the first recessed surface 104 between them and are exposed from the sealing resin 40. The first recessed surface 104 is offset from the first reverse surface 102 and the second reverse surface 103 toward the first side in the thickness direction z and located closer to the first obverse surface 101 than are the first reverse surface 102 and the second reverse surface 103. The first recessed surface 104 is covered with the sealing resin 40. The first end surface 105 is connected to the first obverse surface 101 and the first reverse surface 102 and faces a first side in the first direction x. The second end surface 106 is connected to the first obverse surface 101 and the first reverse surface 102 and faces a second side in the first direction x. The first end surface 105 and the second end surface 106 are exposed from the sealing resin 40.

Figure 9:
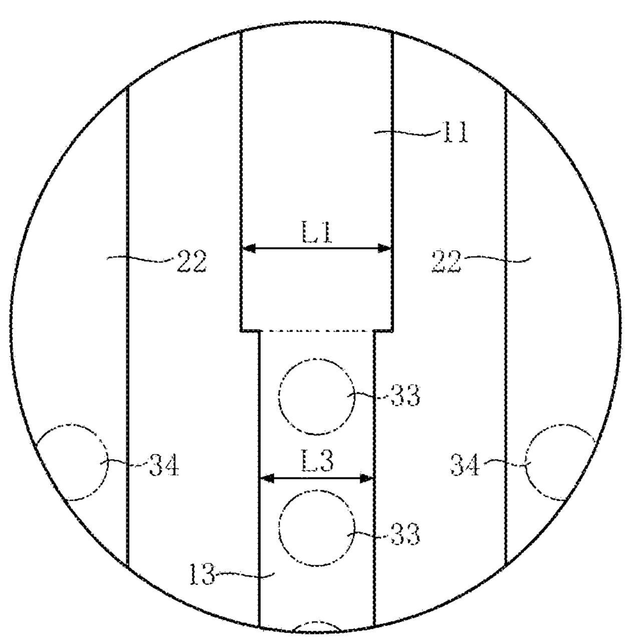
FIG. 9 is a partially enlarged view of FIG. 3.
Figure 10:
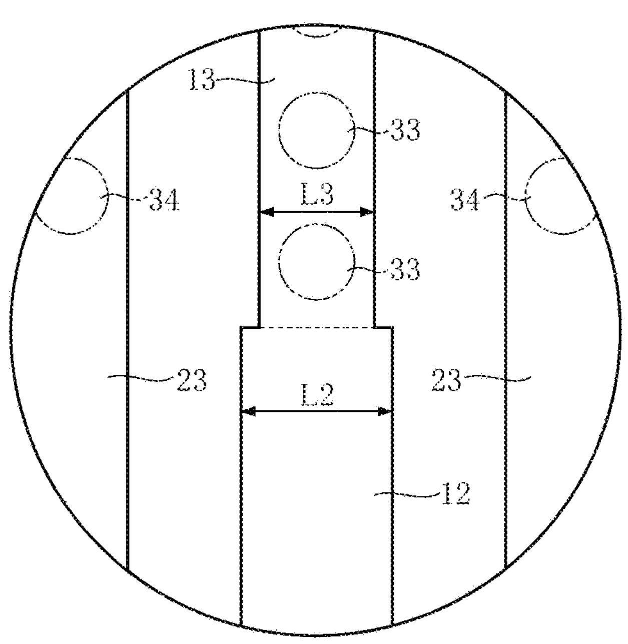
FIG. 10 is a partially enlarged view of FIG. 3.

As shown in FIGS. 12 and 14, each first lead 10 includes a first terminal portion 11, a second terminal portion 12, and a first main portion 13. The first terminal portion 11 defines a part of the first obverse surface 101, the first reverse surface 102 and the first end surface 105 and overlaps with the first reverse surface 102 as viewed in the thickness direction z. (In other words, the first terminal portion 11 forms a part of the first obverse surface 101, the first reverse surface 102 and the first end surface 105.) The second terminal portion 12 defines a part of the first obverse surface 101, the second reverse surface 103 and the second end surface 106 and overlaps with the second reverse surface 103 as viewed in the thickness direction z. (In other words, the second terminal portion 12 forms a part of the first obverse surface 101, the second reverse surface 103 and the second end surface 106.) The first main portion 13 defines a part of the first obverse surface 101 and the first recessed surface 104 and overlaps with the first recessed surface 104 as viewed in the thickness direction z. The first terminal portion 11 and the second terminal portion 12 are connected to opposite ends of the first main portion 13 in the first direction x. As shown in FIG. 9, the dimension L1 of the first terminal portion 11 in the second direction y is greater than the dimension L3 of the first main portion 13 in the second direction y. Also, as shown in FIG. 10, the dimension L2 of the second terminal portion 12 in the second direction y is greater than the dimension L3 of the first main portion 13 in the second direction y.

In each of the first leads 10, the first obverse surface 101, on which the semiconductor element 30 is supported, may be plated with silver (Ag), for example. The first reverse surface 102, the second reverse surface 103, the first end surface 105 and the second end surface 106, which are exposed from the sealing resin 40, may be plated with tin (Sn), for example. Instead of tin plating, plating with nickel (Ni), palladium (Pd) and gold (Au) may be performed in that order to form a laminate of metal-plating layers.

As shown in FIGS. 3 and 4, each of the second leads 20 extends in the first direction x. In the present embodiment, the second leads 20 are arranged at predetermined intervals in the second direction y. Each of the second leads 20 is disposed between a pair of first leads 10 adjacent to each other in the second direction y. The first leads 10 and the second leads 20 are alternately arranged in the second direction y. Each of the second leads 20 outputs the AC power (voltage) converted by the switching circuit 321 in the semiconductor element 30.

Figure 13:
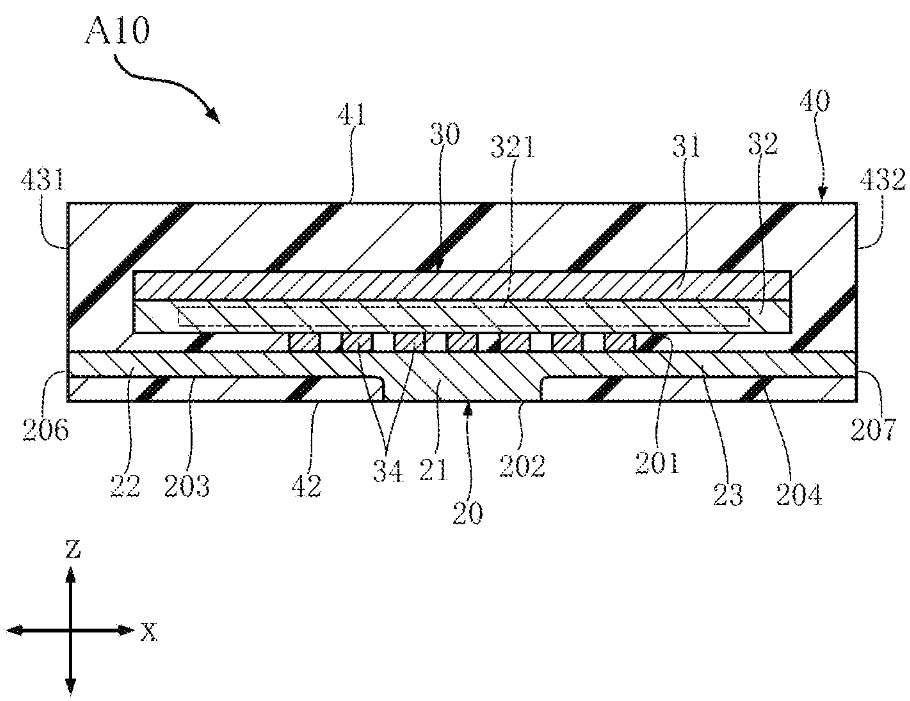
FIG. 13 is a sectional view taken along line XIII-XIII in FIG. 3.

As shown in FIGS. 11 and 13, each of the second leads 20 has a second obverse surface 201, a third reverse surface 202, a second recessed surface 203, a third recessed surface 204, a fourth recessed surface 205 (see also FIG. 4), a third end surface 206 and a fourth end surface 207. The second obverse surface 201 faces the same side as the first obverse surface 101 of the first lead 10 in the thickness direction z and is opposite to the semiconductor element 30. The second obverse surface 201 is covered with the sealing resin 40. The semiconductor element 30 is supported on the second obverse surface 201.

The third reverse surface 202, the second recessed surface 203, the third recessed surface 204 and the fourth recessed surface 205 face away from the second obverse surface 201 (i.e., face the second side in the thickness direction z). The second recessed surface 203 and the third recessed surface 204 are spaced apart from each other in the first direction x with the third reverse surface 202 between them. The second recessed surface 203 and the third recessed surface 204 are offset from the third reverse surface 202 toward the first side in the thickness direction z and located closer to the second obverse surface 201 than is the third reverse surface 202. The second recessed surface 203 and the third recessed surface 204 are covered with the sealing resin 40. The third reverse surface 202 is located between the second recessed surface 203 and the third recessed surface 204 in the first direction x and exposed from the sealing resin 40. The fourth recessed surface 205 is offset from the third reverse surface 202 toward the first side in the thickness direction z and located closer to the second obverse surface 201 than is the third reverse surface 202. The fourth recessed surface 205 is covered with the sealing resin 40. The third end surface 206 is connected to the second obverse surface 201 and the second recessed surface 203 and faces the first side in the first direction x. The fourth end surface 207 is connected to the second obverse surface 201 and the third recessed surface 204 and faces the second side in the first direction x. The third end surface 206 and the fourth end surface 207 are exposed from the sealing resin 40.

As shown in FIGS. 11 and 13, each second lead 20 includes a third terminal portion 21, a second main portion 22, a third main portion 23, and a protruding portion 24. The third terminal portion 21 defines a part of the second obverse surface 201 and the third reverse surface 202 and overlaps with the third reverse surface 202 as viewed in the thickness direction z. The second main portion 22 defines a part of the second obverse surface 201, the second recessed surface 203 and the third end surface 206 and overlaps with the second recessed surface 203 as viewed in the thickness direction z. The third main portion 23 defines a part of the second obverse surface 201, the third recessed surface 204 and the fourth end surface 207 and overlaps with the third recessed surface 204 as viewed in the thickness direction z. The second main portion 22 and the third main portion 23 are connected to opposite ends of the third terminal portion 21 in the first direction x. As shown in FIG. 11, the protruding portion 24 forms a part of the second obverse surface 201 and the fourth recessed surface 205 and protrudes from the third terminal portion 21 in the second direction y. In the present embodiment, the protruding portion 24 has two parts protruding from opposite ends of the third terminal portion 21 in the second direction y and flanks the third terminal portion 21 in the second direction y.

As shown in the figures such as FIGS. 3 and 4, in each of the second leads 20, the third terminal portion 21 is located at the center of the second lead 20 in the first direction x. As viewed in the second direction y, the third terminal portions 21 do not overlap with either the first terminal portions 11 or the second terminal portions 12 of the first leads 10.

In each of the second leads 20, the second obverse surface 201, on which the semiconductor element 30 is supported, may be plated with silver, for example. The third reverse surface 202, the third end surface 206 and the fourth end surface 207, which are exposed from the sealing resin 40, may be plated with tin, for example. Instead of tin plating, plating with nickel, palladium and gold may be performed in that order to form a laminate of metal-plating layers.

Figure 8:
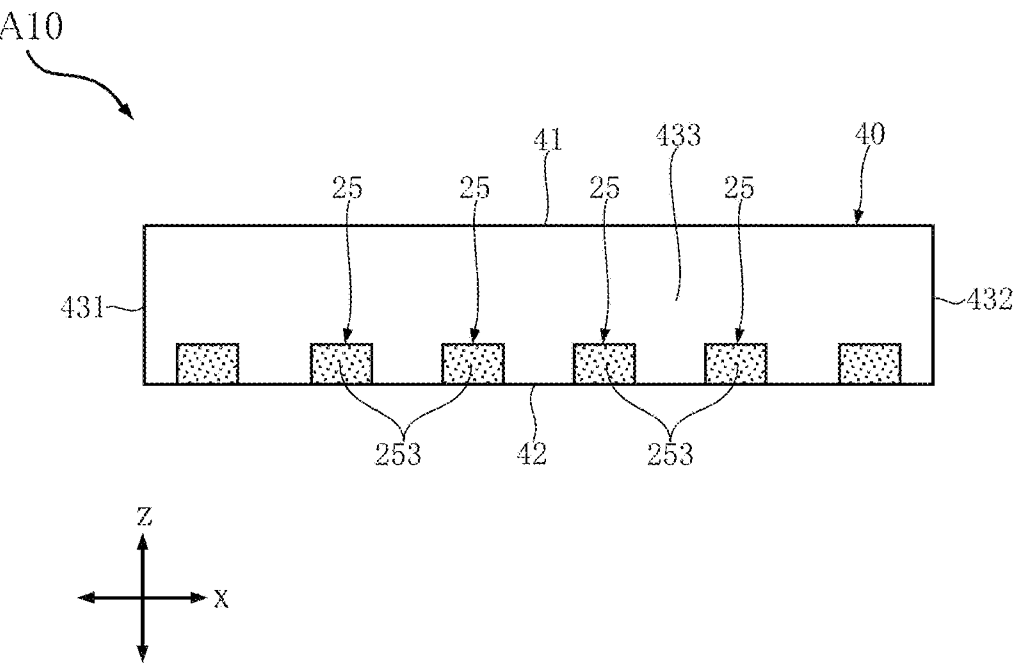
FIG. 8 is a left side view of the semiconductor device shown in FIG. 1.

As shown in FIG. 3, the third leads 25 are located on the first side of the first leads 10 in the second direction y. Each of the third leads 25 receives a power (voltage) to drive the control circuit 322 or an electric signal for transmission to the control circuit 322. As shown in FIGS. 3, 4 and 11, each of the third leads 25 has a third obverse surface 251, a fourth reverse surface 252 and a fifth end surface 253. The third obverse surface 251 faces the same side as the first obverse surface 101 of the first lead 10 in the thickness direction z and is opposite to the semiconductor element 30. The third obverse surface 251 is covered with the sealing resin 40. The semiconductor element 30 is supported on the third obverse surface 251. The fourth reverse surface 252 faces away from the third obverse surface 251 (i.e., faces the second side in the thickness direction z). The fourth reverse surface 252 is exposed from the sealing resin 40. The fifth end surface 253 is connected to the third obverse surface 251 and the fourth reverse surface 252 and faces the first side in the second direction y. The fifth end surface 253 is exposed from the sealing resin 40. As shown in FIG. 8, the fifth end surfaces 253 of the third lead 25 are arranged at predetermined intervals along the first direction x.

In each of the third leads 25, the third obverse surface 251, on which the semiconductor element 30 is supported, may be plated with silver, for example. The fourth reverse surface 252 and the fifth end surface 253, which are exposed from the sealing resin 40, may be plated with tin, for example. Instead of tin plating, plating with nickel, palladium and gold may be performed in that order to form a laminate of metal-plating layers.

Figure 5:
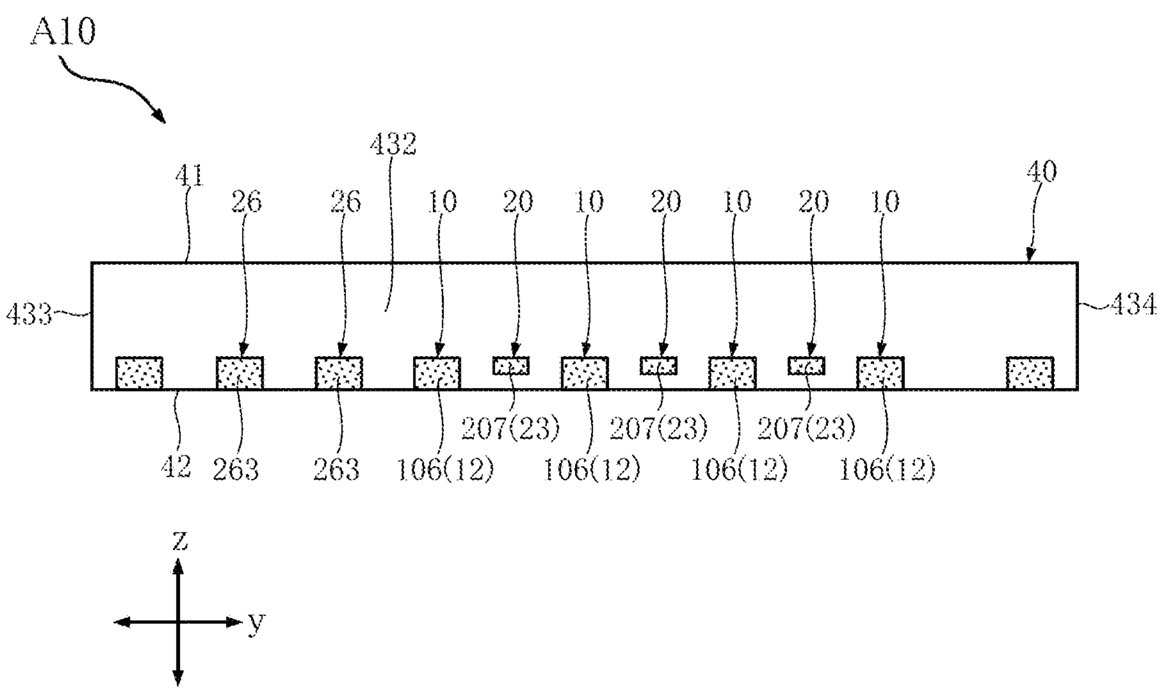
FIG. 5 is a front view of the semiconductor device shown in FIG. 1.
Figure 6:
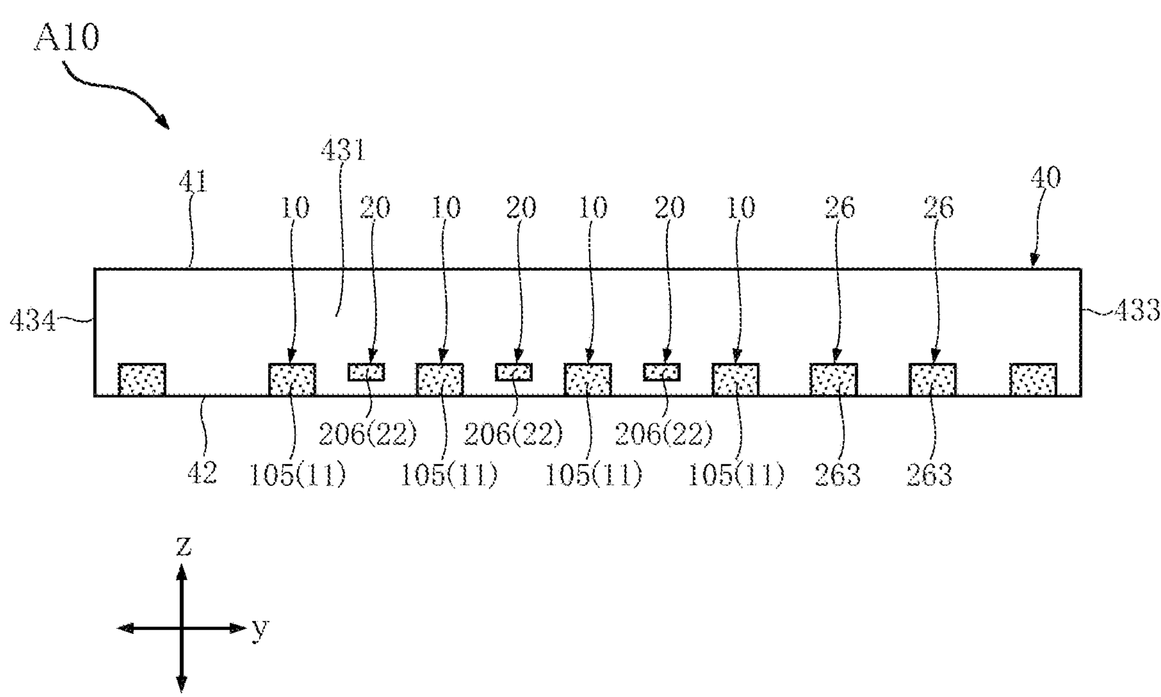
FIG. 6 is a rear view of the semiconductor device shown in FIG. 1.
Figure 15:
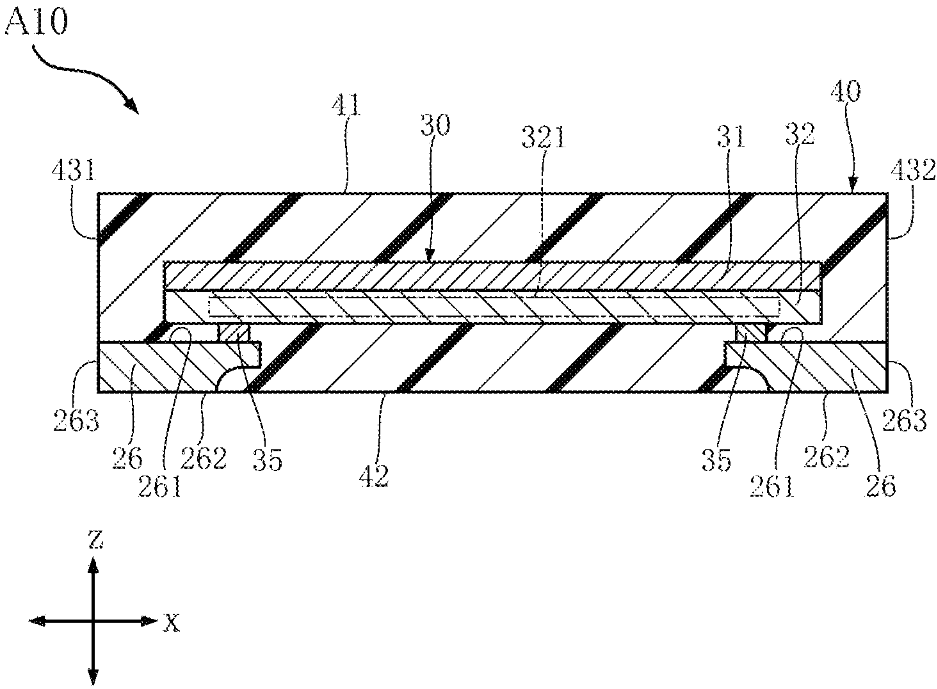
FIG. 15 is a sectional view taken along line XV-XV in FIG. 3.

As shown in FIG. 3, the leads 26 are located between the first leads 10 and the third leads 25 in the second direction y. Some of the leads 26 are spaced apart from the remaining leads 26 in the first direction x. Each of the leads 26 receives an electric signal for transmission to the control circuit 322. As shown in FIGS. 3, 4 and 15, each of the leads 26 has an obverse surface 261, a reverse surface 262 and an end surface 263. The obverse surface 261 faces the same side as the first obverse surface 101 of the first lead 10 in the thickness direction z and is opposite to the semiconductor element 30. The obverse surface 261 is covered with the sealing resin 40. The semiconductor element 30 is supported on the obverse surface 261. The reverse surface 262 faces away from the obverse surface 261 (i.e., faces the second side in the thickness direction z). The reverse surface 262 is exposed from the sealing resin 40. The end surface 263 is connected to the obverse surface 261 and the reverse surface 262 and faces the first side or the second side in the second direction y. The end surface 263 is exposed from the sealing resin 40. As shown in FIGS. 5 and 6, the end surfaces 263 are aligned with the first end surfaces 105 (or the second end surfaces 106) of the first leads 10 and the third end surfaces 206 (or the fourth end surfaces 207) of the second leads 20 along the second direction y.

In each of the leads 26, the obverse surface 261, on which the semiconductor element 30 is supported, may be plated with silver, for example. The reverse surface 262 and the end surface 263, which are exposed from the sealing resin 40, may be plated with tin, for example. Instead of tin plating, plating with nickel, palladium and gold may be performed in that order to form a laminate of metal-plating layers.

As shown in FIG. 3, the fourth lead 27 is located on the second side of the first leads 10 in the second direction y. The fourth lead 27 is an input terminal that receives DC power (voltage) to be converted in the semiconductor device A10. The fourth lead 27 is a negative electrode (N terminal).

As shown in FIGS. 3, 4 and 11, the fourth lead 27 has a fourth obverse surface 271, a fifth reverse surface 272, a fifth recessed surface 273 and a plurality of sixth end surfaces 274. The fourth obverse surface 271 faces the same side as the first obverse surface 101 of the first lead 10 in the thickness direction z and is opposite to the semiconductor element 30. The fourth obverse surface 271 is covered with the sealing resin 40. The semiconductor element 30 is supported on the fourth obverse surface 271.

Figure 7:
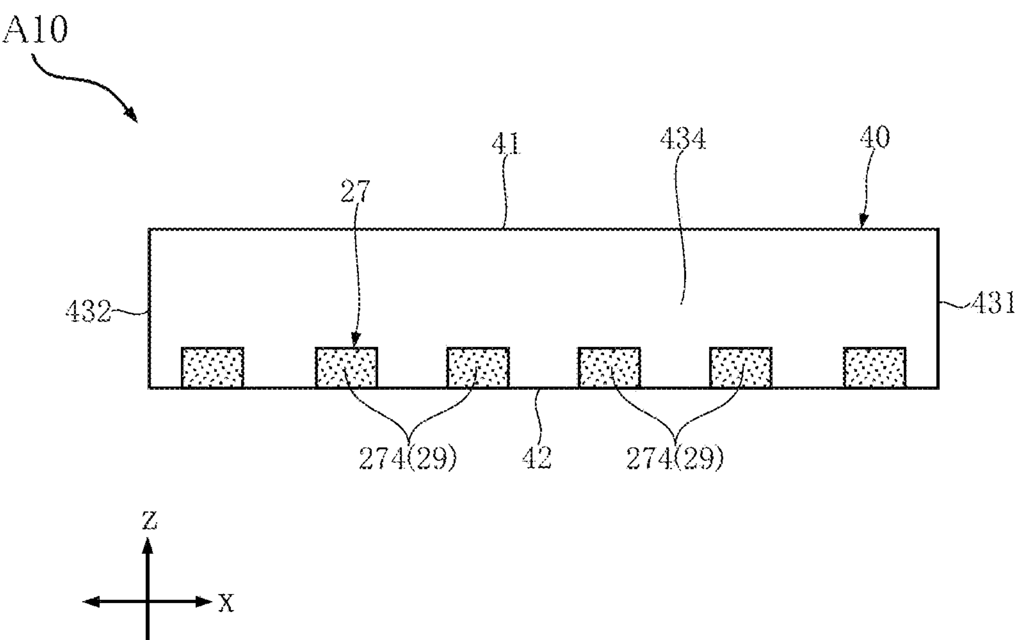
FIG. 7 is a right side view of the semiconductor device shown in FIG. 1.

The fifth reverse surface 272 and the fifth recessed surface 273 face away from the fourth obverse surface 271 (i.e., face the second side in the thickness direction z). In the present embodiment, the fifth reverse surface 272 is divided into a plurality of regions spaced apart from each other in the first direction x. In the fourth lead 27, the fifth recessed surface 273 is offset toward the first side in the second direction y. The fifth recessed surface 273 is located closer to the fourth obverse surface 271 than is the fifth reverse surface 272. The fifth recessed surface 273 is covered with the sealing resin 40. Each of the sixth end surfaces 274 is connected to the fourth obverse surface 271 and the fifth reverse surface 272 and faces the second side in the second direction y. The sixth end surfaces 274 are exposed from the sealing resin 40. As shown in FIG. 7, the sixth end surfaces 274 are arranged at predetermined intervals along the first direction x.

As shown in FIGS. 3, 4 and 11, the fourth lead 27 includes a fourth main portion 28 and a plurality of fourth terminal portions 29. The fourth main portion 28 defines a part of the fourth obverse surface 271 and the fifth recessed surface 273 and extends in the first direction x. Each of the fourth terminal portions 29 protrudes from the fourth main portion 28 toward the second side in the second direction y. The fourth terminal portions 29 are aligned in a mutually spaced manner. Each of the fourth terminal portions 29 defines a part of the fourth obverse surface 271, a part of the fifth reverse surface 272 and the sixth end surfaces 274.

In the fourth lead 27, the fourth obverse surface 271, on which the semiconductor element 30 is supported, may be plated with silver. The fifth reverse surface 272 and the sixth end surfaces 274, which are exposed from the sealing resin 40, may be plated with tin, for example. Instead of tin plating, plating with nickel, palladium and gold may be performed in that order to form a laminate of metal-plating layers.

As shown in FIGS. 11 to 15, the semiconductor element 30 is supported on the first leads 10, the second leads 20, the third leads 25, the leads 26 and the fourth lead 27. The semiconductor element 30 is covered with the sealing resin 40. The semiconductor element 30 has a semiconductor substrate 31, a semiconductor layer 32, a plurality of first electrodes 33, a plurality of second electrodes 34, a plurality of third electrodes 35 and a plurality of fourth electrodes 36.

As shown in FIGS. 11 to 15, the semiconductor substrate 31 supports, below it, the semiconductor layer 32, the first electrodes 33, the second electrodes 34, the third electrodes 35 and the fourth electrodes 36. The constituent material of the semiconductor substrate 31 may be Si (silicon) or silicon carbide (SiC), for example.

The semiconductor layer 32 is laminated on the semiconductor substrate 31 to face the first obverse surfaces 101 of the first leads 10 in the thickness direction z. The semiconductor layer 32 contains various kinds of p-type semiconductors and n-type semiconductors which differ in amount of doped elements. The switching circuit 321 and the control circuit 322 electrically connected to the switching circuit 321 are contained in the semiconductor layer 32. The switching circuit 321 may be a MOSFET (Metal-Oxide-Semiconductor Field-Effect Transistor) or an IGBT (Insulated Gate Bipolar Transistor), for example. In the example of the semiconductor device A10, the switching circuit 321 is divided into two regions, i.e., a high-voltage region (upper arm circuit) and a low-voltage region (lower arm circuit). Each region is constituted by a single n-channel MOSFET. The control circuit 322 contains e.g., a gate driver for driving the switching circuit 321 or a bootstrap circuit for the high-voltage region of the switching circuit 321 and is configured to control the switching circuit 321. The semiconductor layer 32 also contains a wiring layer (not shown). The wiring layer electrically connects the switching circuit 321 and the control circuit 322 to each other.

As shown in FIGS. 11 to 15, the first electrodes 33, the second electrodes 34, the third electrodes 35 and the fourth electrodes 36 are provided to face the first obverse surfaces 101 of the first lead 10 in the thickness direction z. The first electrodes 33, the second electrodes 34, the third electrodes 35 and the fourth electrodes 36 are held in contact with the semiconductor layer 32.

The first electrodes 33, the second electrodes 34 and the fourth electrodes 36 are electrically connected to the switching circuit 321 of the semiconductor layer 32. The first electrodes 33 are connected to the first obverse surfaces 101 of the first leads 10. Thus, the first leads 10 are electrically connected to the switching circuit 321. The second electrode 34 are connected to the second obverse surfaces 201 of the second leads 20. Thus, the second leads 20 are electrically connected to the switching circuit 321. As shown in the figures such as FIGS. 3, 11 and 13, in the present embodiment, at least one second electrode 34 overlaps with each of the third terminal portions 21 as viewed in the thickness direction z. In the illustrated example, three second electrodes 34 overlap with each third terminal portion 21. The fourth electrodes 36 are connected to the fourth obverse surface 271 of the fourth lead 27. Thus, the fourth lead 27 is electrically connected to the switching circuit 321.

The third electrodes 35 are electrically connected to the control circuit 322 in the semiconductor layer 32. Some of the third electrodes 35 are connected to the third obverse surfaces 251 of the third leads 25. Other third electrodes 35 are connected to the obverse surfaces 261 of the leads 26. Thus, the third leads 25 and the leads 26 are electrically connected to the control circuit 322. The constituent material of the first electrodes 33, the second electrodes 34, the third electrodes 35 and the fourth electrodes 36 may include copper, for example.

As shown in FIGS. 5 to 8, the sealing resin 40 has a top surface 41, a bottom surface 42, a first (resin) side surface 431, a second (resin) side surface 432, a third (resin) side surface 433 and a fourth (resin) side surface 434. The constituent material of the sealing resin 40 may be black epoxy resin, for example.

As shown in FIGS. 11 to 15, the top surface 41 faces the same side as the first obverse surfaces 101 of the first lead 10 in the thickness direction z. As shown in FIGS. 5 to 8, the bottom surface 42 faces away from the top surface 41. As shown in FIGS. 4 and 11 to 15, the first reverse surfaces 102 and the second reverse surfaces 103 of the first leads 10, the third reverse surfaces 202 of the second leads 20, the fourth reverse surfaces 252 of the third leads 25, the reverse surfaces 262 of the leads 26 and the fifth reverse surface 272 of the fourth lead 27 are exposed at the bottom surface 42.

As shown in FIGS. 7 and 8, the first side surface 431 is connected to the top surface 41 and the bottom surface 42 and faces the first side in the first direction x. The second side surface 432 is connected to the top surface 41 and the bottom surface 42 and faces the second side in the first direction x. The first side surface 431 and the second side surface 432 are spaced apart from each other in the first direction x. As shown in FIGS. 12 to 15, the first end surfaces 105 of the first leads 10, the third end surfaces 206 of the second leads 20, and the end surfaces 263 of some of the leads 26 are exposed at the first side surface 431 to be flush with the first side surface 431. The second end surfaces 106 of the first leads 10, the fourth end surfaces 207 of the second leads 20, and the end surfaces 263 of some of the leads 26 are exposed at the second side surface 432 to be flush with the second side surface 432.

As shown in FIGS. 5 and 6, the third side surface 433 is connected to the top surface 41, the bottom surface 42, the first side surface 431 and the second side surface 432 and faces the first side in the second direction y. The fourth side surface 434 is connected to the top surface 41, the bottom surface 42, the first side surface 431 and the second side surface 432 and faces the second side in the second direction y. The third side surface 433 and the fourth side surface 434 are spaced apart from each other in the second direction y. As shown in FIG. 11, the fifth end surfaces 253 of the third leads 25 are exposed at the third side surface 433 to be flush with the third side surface 433. The sixth end surfaces 274 of the fourth terminal portions 29 of the fourth lead 27 are exposed at the fourth side surface 434 to be flush with the fourth side surface 434.

The advantages of the present embodiment are described below.

The semiconductor device A10 includes first leads 10, which extend in the first direction x and to which the first electrode 33 of the semiconductor element 30 are connected, and the sealing resin 40 that partially covers the first leads 10. Each of the first leads 10 has a first reverse surface 102, a second reverse surface 103 and a first recessed surface 104 that face away from the first obverse surface 101 in the thickness direction z. The first reverse surface 102 and the second reverse surface 103 are spaced apart from each other in the first direction x with the first recessed surface 104 between them and are exposed at the bottom surface 42 of the sealing resin 40. The first recessed surface 104 is covered with the sealing resin 40. The first leads 10 are arranged at predetermined intervals in the second direction y. When the semiconductor device A10 is mounted to a circuit board, the first reverse surfaces 102 and the second reverse surfaces 103 of the first leads 10 are used as bond portions to the circuit board. In the present embodiment, the first reverse surfaces 102 and the second reverse surfaces 103 of the first leads 10 are distributed in both the first direction x and the second direction y. Such a configuration allows the heat generated in the semiconductor element 30 to be released in a dispersed manner. Thus, the semiconductor device A10 dissipates the heat from the semiconductor element 30 more uniformly. Moreover, the plurality of first reverse surfaces 102 and second reverse surfaces 103 are used as bond portions during the mounting to a circuit board. Such a large number of bond portions improves the mounting reliability.

The semiconductor device A10 includes second leads 20 elongated in the first direction x. Each of the second leads 20 has a second obverse surface 201, to which second electrodes 34 of the semiconductor element 30 are connected, and a third reverse surface 202, a second recessed surface 203 and a third recessed surface 204 that face away from the second obverse surface 201 in the thickness direction z. The second recessed surface 203 and the third recessed surface 204 are spaced apart from each other in the first direction x with the third reverse surface 202 between them. The third reverse surface 202 is exposed at the bottom surface 42 of the sealing resin 40. When the semiconductor device A10 is mounted to a circuit board, the third reverse surfaces 202 of the second leads 20 are used as bond portions to the circuit board. In the first direction x, the third reverse surface 202 is located in the middle of the second lead 20 extending in the first direction x. With such a configuration, the second recessed surface 203 of the second lead 20 improves the mounting reliability while separating the first reverse surfaces 102 and the second reverse surfaces 103 of the first leads 10.

As shown in FIGS. 3 and 4, in the present embodiment, each second lead 20 is disposed between a pair of adjacent first leads 10 in the second direction y. The semiconductor device A10 includes a plurality of second leads 20, and the first leads 10 and the second leads 20 are alternately arranged in the second direction y. With such a configuration, in a pair of adjacent first leads 10, respective first reverse surfaces 102 are not too close to each other, so are respective second reverse surfaces 103. Also, in a first lead 10 and a second lead 20 adjacent to each other, the first reverse surface 102 or the second reverse surface 103 and the third reverse surface 202 are not too close to each other. Thus, a large number of first reverse surfaces 102, second reverse surfaces 103 and third reverse surface 202 can be arranged in a space-efficient manner. This is desirable for improving the heat dissipation and mounting reliability of the semiconductor device A10.

Each first lead 10 includes a first terminal portion 11 defining a first reverse surface 102 and a second terminal portion 12 defining a second reverse surface 103. Each second lead 20 includes a third terminal portion 21 defining a third reverse surface 202. The third terminal portions 21 of the second leads 20 do not overlap with either the first terminal portions 11 or the second terminal portions 12 of the first leads 10 as viewed in the second direction y. Such a configuration assures that, in a first lead 10 and a second lead 20 adjacent to each other, the first reverse surface 102 or the second reverse surface 103 and the third reverse surface 202 are not too close to each other.

Each first lead 10 includes a first main portion 13 defining a first recessed surface 104. Respective dimensions L1 and L2 of the first terminal portions 11 and the second terminal portions 12 in the second direction y are greater than the dimension L3 of the first main portions 13 in the second direction y. With such a configuration, the alignment pitch of the first leads 10 adjacent to each other with a second lead 20 between them in the second direction y can be reduced. This is desirable for the size reduction of the semiconductor device A10.

For the second electrodes 34 connected to the second obverse surfaces 201 of the second leads 20, at least one second electrode 34 overlaps with each of the third terminal portions 21. Thus, the semiconductor element 30 is supported by the third terminal portions 21, which stabilizes the support state of the semiconductor element 30.

Each second lead 20 includes a protruding portion 24 protruding from the third terminal portion 21 in the second direction y. The protruding portion 24 forms a part of the second obverse surface 201 and the fourth recessed surface 205 facing away from the second obverse surface 201. The fourth recessed surface 205 is covered with the sealing resin 40. With the configuration including the protruding portion 24 connected to the third terminal portion 21, the second lead 20 is prevented from falling out through the bottom surface 42. Thus, the second electrodes 34 are properly kept connected to the second obverse surface 201.

Figure 16:
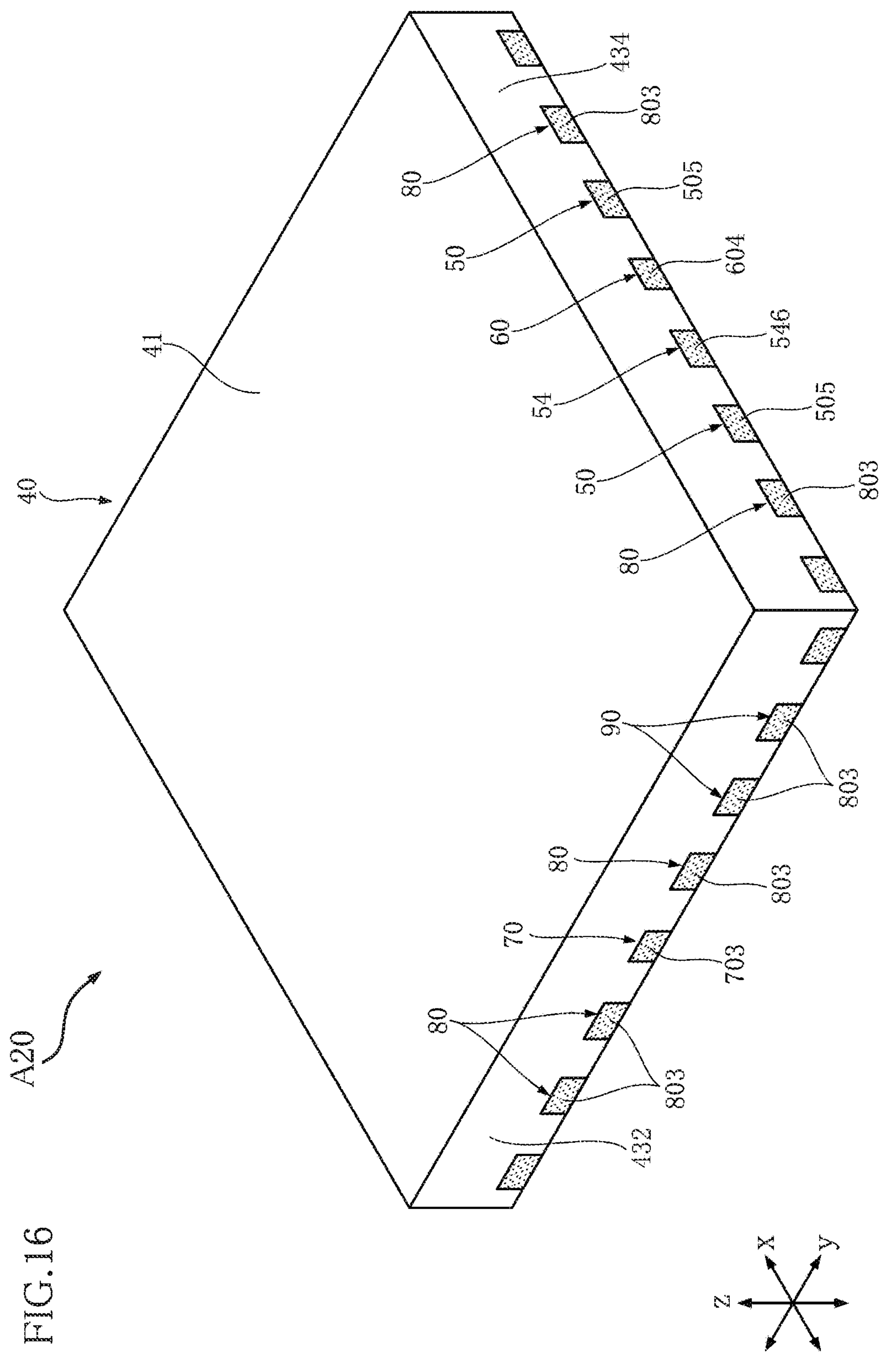
FIG. 16 is a perspective view of a semiconductor device according to a second embodiment of the present disclosure.

A semiconductor device A20 according to a second embodiment of the present disclosure is described below with reference to FIGS. 16 to 28. In FIG. 16 and subsequent figures, the elements that are identical or similar to those of the semiconductor device A10 described above are denoted by the same reference signs, and the descriptions thereof are omitted. In the description of the elements of the semiconductor device A20, the "lead" mentioned first is referred to as a “fifth lead” rather than a “first lead” to avoid confusion with the elements of the semiconductor device A10 described above. This holds for other elements.

The semiconductor device A20 includes a plurality of fifth leads 50, a lead 54, a sixth lead 60, a pair of seventh leads 70, a plurality of leads 80, a semiconductor element 30 and a sealing resin 40. As shown in FIG. 16, the package type of the semiconductor device A20 is the QFN. The semiconductor element 30 is an LSI of a flip-chip type containing a switching circuit 321 and a control circuit 322. In the semiconductor device A20, DC power (voltage) is converted to AC power (voltage) by the switching circuit 321. The semiconductor device A20 may be used for an element of a DC/DC converter circuit, for example. For convenience of understanding, the sealing resin 40 is shown as transparent in FIG. 17, and the semiconductor element 30 and the sealing resin 40 are shown as transparent in FIG. 18. In these figures, the outlines of the semiconductor element 30 and the sealing resin 40 shown as transparent are indicated by imaginary lines (two-dot chain lines).

Figure 17:
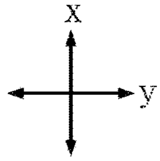
FIG. 17 is a plan view of the semiconductor device shown in FIG. 16 (as seen through a sealing resin).

In the description of the semiconductor device A20, the thickness direction z of the fifth lead 50 is defined as a “thickness direction z”. A direction orthogonal to the thickness direction z is defined as a “first direction x”. The direction orthogonal to the thickness direction z and the first direction x is defined as a “second direction y”. As shown in FIGS. 16 and 17, the semiconductor device A20 is square as viewed in the thickness direction z.

The fifth leads 50, the lead 54, the sixth lead 60, the pair of seventh leads 70 and the leads 80 support the semiconductor element 30 as shown in FIG. 17 and serve as the terminals for mounting the semiconductor device A20 to a circuit board. As shown in FIGS. 23 to 28, each of the first leads 10, second leads 20, third leads 25, leads 26 and fourth lead 27 is partially covered with the sealing resin 40. The fifth leads 50, the lead 54, the sixth lead 60, the pair of seventh leads 70 and the leads 80 are formed from a same lead frame. The constituent material of the lead frame may be copper or a copper alloy, for example.

Figure 18:
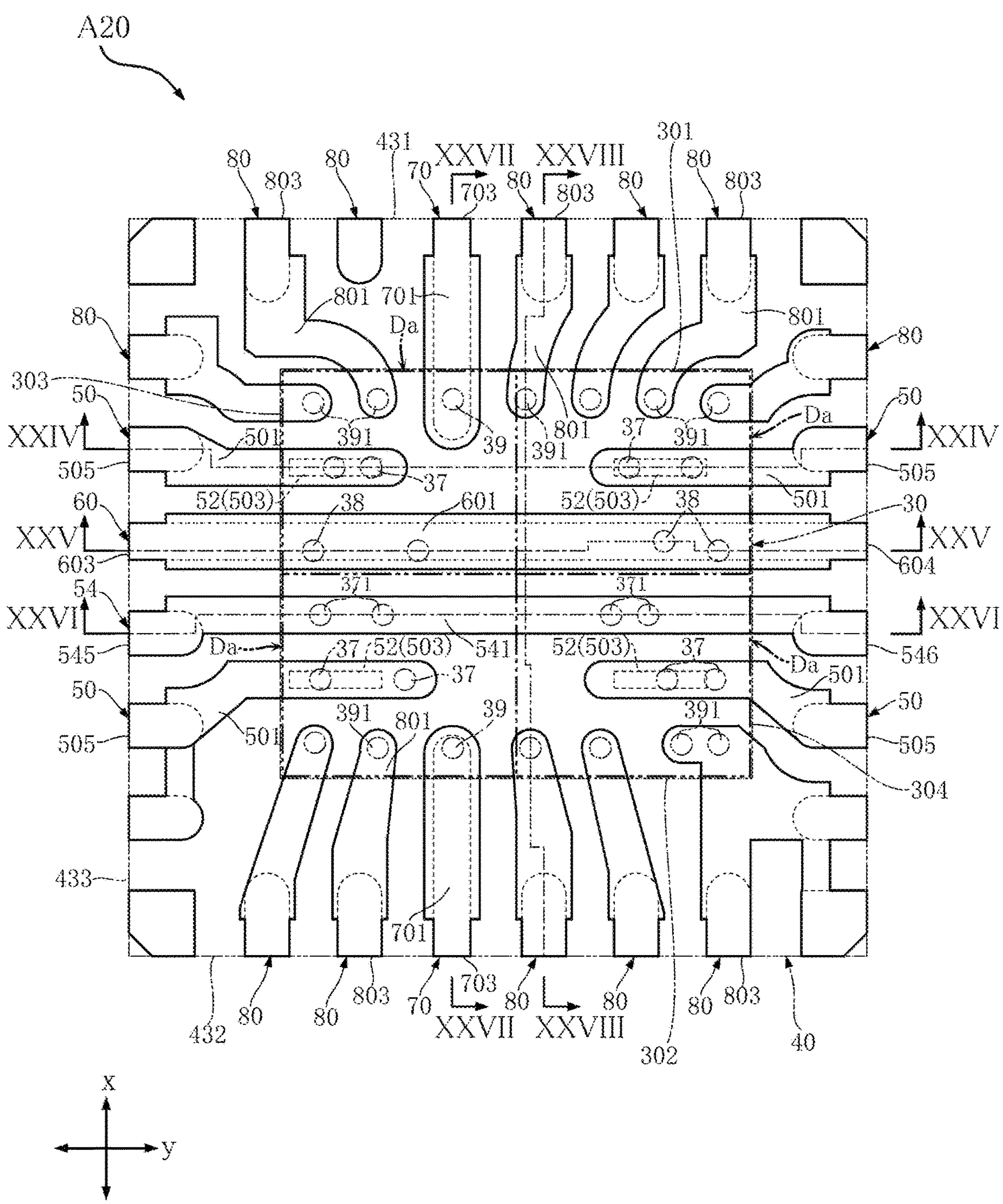
FIG. 18 is a plan view of the semiconductor device shown in FIG. 16 (as seen through a semiconductor element and the sealing resin).
Figure 19:
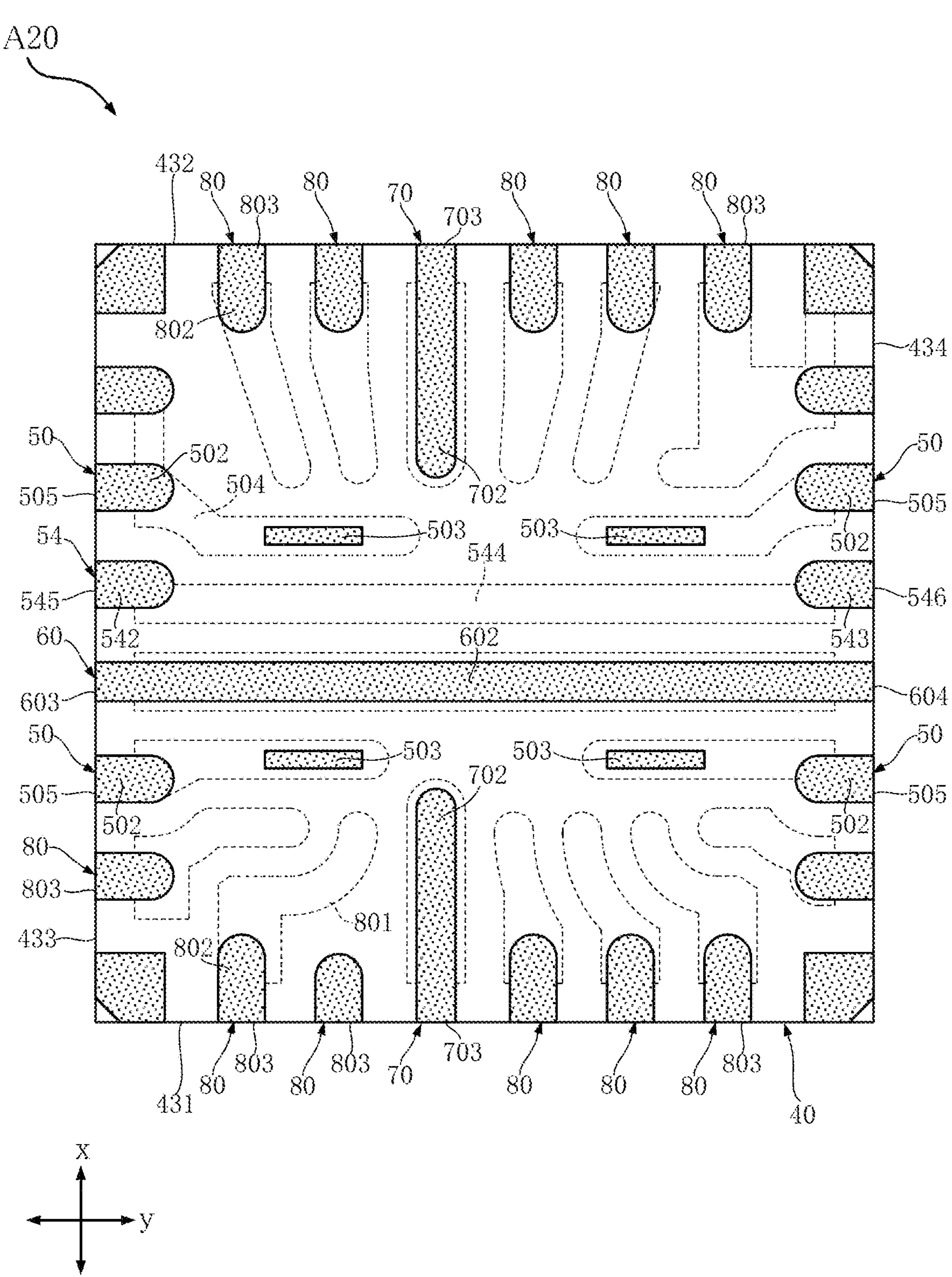
FIG. 19 is a bottom view of the semiconductor device shown in FIG. 16.

As shown in FIGS. 18 and 19, the fifth leads 50 are disposed on the first side and the second side of the semiconductor device A20 in the second direction y. In the present embodiment, two (a pair) of the fifth leads 50 are disposed on the first side in the second direction y, and another two (a pair) of the fifth leads 50 are disposed on the second side in second direction y. In the present embodiment, each of the fifth leads 50 extends generally in the second direction y. The pair of fifth leads 50 located on the first side in the second direction y are spaced apart from each other in the first direction x. The pair of fifth leads 50 located on the second side in the second direction y are spaced apart from each other in the first direction x. Each of the fifth leads 50 outputs the AC power (voltage) converted by the switching circuit 321 in the semiconductor element 30.

Figure 24:
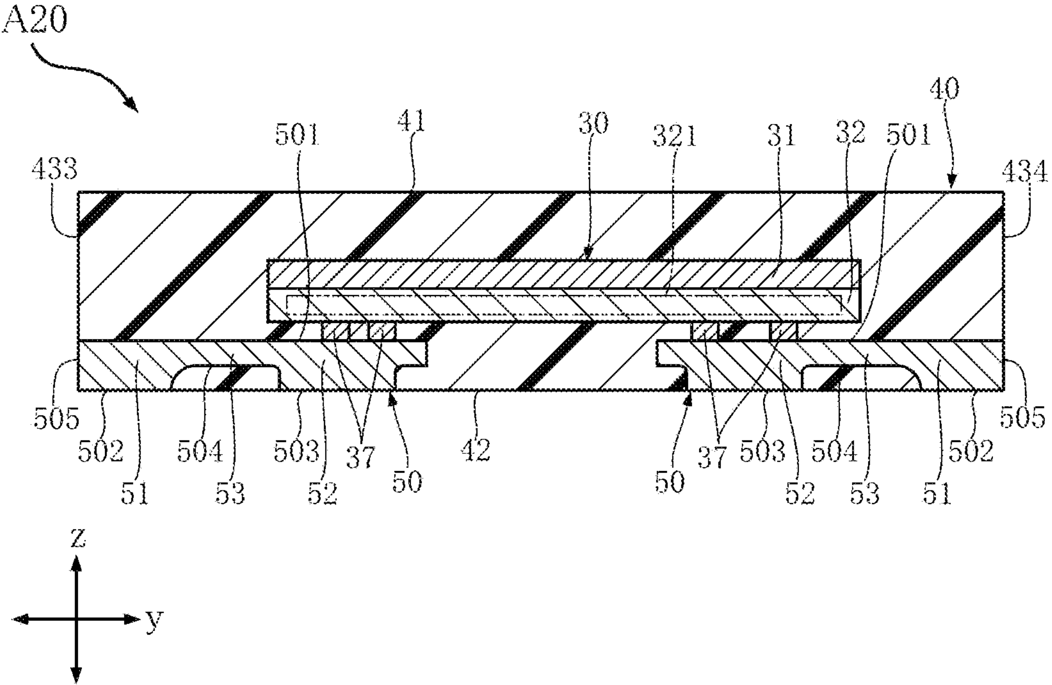
FIG. 24 is a sectional view taken along line XXIV-XXIV in FIG. 18.

As shown in FIG. 24, each of the fifth leads 50 has a fifth obverse surface 501, a sixth reverse surface 502, a seventh reverse surface 503, a sixth recessed surface 504 and a seventh end surface 505. The seventh end surface 505 faces the first side in the thickness direction z and is opposite to the semiconductor element 30. The seventh end surface 505 is covered with the sealing resin 40. The semiconductor element 30 is supported on the fifth obverse surface 501.

The sixth reverse surface 502, the seventh reverse surface 503 and the sixth recessed surface 504 faces away from the fifth obverse surface 501 (i.e., faces the second side in the thickness direction z). The sixth reverse surface 502 and the seventh reverse surface 503 are spaced apart from each other in the second direction y with the sixth recessed surface 504 between them and are exposed from the sealing resin 40. The sixth recessed surface 504 is offset from the sixth reverse surface 502 and the seventh reverse surface 503 toward the first side in the thickness direction z and located closer to the fifth obverse surface 501 than are the sixth reverse surface 502 and the seventh reverse surface 503. The sixth recessed surface 504 is covered with the sealing resin 40. The seventh end surface 505 is connected to the fifth obverse surface 501 and the sixth reverse surface 502 and faces the first side or the second side in the second direction y. The seventh end surface 505 is exposed from the sealing resin 40.

As shown in FIG. 24, the fifth lead 50 includes a sixth terminal portion 51, a seventh terminal portion 52 and a sixth main portion 53. The sixth terminal portion 51 defines a part of the fifth obverse surface 501, the sixth reverse surface 502 and the seventh end surface 505 and overlaps with the sixth reverse surface 502 as viewed in the thickness direction z. The seventh terminal portion 52 defines a part of the fifth obverse surface 501 and the seventh reverse surface 503 and overlaps with the seventh reverse surface 503 as viewed in the thickness direction z. The sixth main portion 53 defines a part of the fifth obverse surface 501 and the sixth recessed surface 504 and overlaps with the sixth recessed surface 504 as viewed in the thickness direction z. The sixth terminal portion 51 and the seventh terminal portion 52 are connected to opposite ends of the sixth main portion 53 in the second direction y.

In each of the fifth leads 50, the fifth obverse surface 501, on which the semiconductor element 30 is supported, may be plated with silver, for example. The sixth reverse surface 502, the seventh reverse surface 503 and the seventh end surface 505, which are exposed from the sealing resin 40, may be plated with tin, for example. Instead of tin plating, plating with nickel, palladium and gold may be performed in that order to form a laminate of metal-plating layers.

As shown in FIGS. 18 and 19, the lead 54 extends in the second direction y. In the present embodiment, the lead 54 is located in the middle of the semiconductor device A20 in the first direction x. The lead 54 is an input terminal that receives DC power (voltage) to be converted in the semiconductor device A20. The lead 54 is a positive electrode (P terminal).

Figure 26:
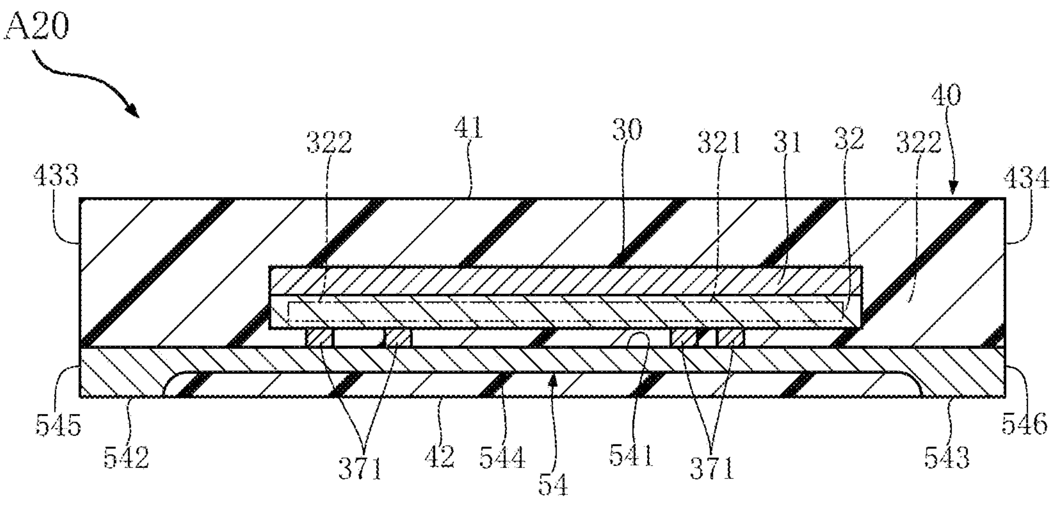
FIG. 26 is a sectional view taken along line XXVI-XXVI in FIG. 18.

As shown in FIG. 26, the lead 54 has an obverse surface 541, a reverse surface 542, a reverse surface 543, a recessed surface 544, an end surface 545 and an end surface 546. The obverse surface 541 faces the same side as the fifth obverse surfaces 501 of the fifth leads 50 in the thickness direction z and is opposite to the semiconductor element 30. The obverse surface 541 is covered with the sealing resin 40. The semiconductor element 30 is supported on the obverse surface 541.

The reverse surface 542, the reverse surface 543 and the recessed surface 544 face away from the obverse surface 541 (i.e., faces the second side in the thickness direction z). The reverse surface 542 and the reverse surface 543 are spaced apart from each other in the second direction y with the recessed surface 544 between them and are exposed from the sealing resin 40. The reverse surface 542 is located on the first side in the second direction y, and the reverse surface 543 is located on the second side in the second direction y. The recessed surface 544 is offset from the reverse surface 542 and the reverse surface 543 toward the first side in the thickness direction z and located closer to the obverse surface 541 than are the reverse surface 542 and the reverse surface 543. The recessed surface 544 is covered with the sealing resin 40. The end surface 545 is connected to the obverse surface 541 and the reverse surface 542 and faces the first side in the second direction y. The end surface 546 is connected to the obverse surface 541 and the reverse surface 542 and faces the second side in the second direction y. The end surface 545 and the end surface 546 are exposed from the sealing resin 40.

In the lead 54, the obverse surface 541, on which the semiconductor element 30 is supported, may be plated with silver, for example. The reverse surface 542, the reverse surface 543, the end surface 545 and the end surface 546, which are exposed from the sealing resin 40, may be plated with tin, for example. Instead of tin plating, plating with nickel, palladium and gold may be performed in that order to form a laminate of metal-plating layers.

As shown in FIGS. 18 and 19, the sixth lead 60 extends in the second direction y. In the present embodiment, the sixth lead 60 is located in the middle of the semiconductor device A20 in the first direction x. The sixth lead 60 is an input terminal that receives DC power (voltage) to be converted in the semiconductor device A20. The sixth lead 60 is a negative electrode (N terminal).

Figure 25:
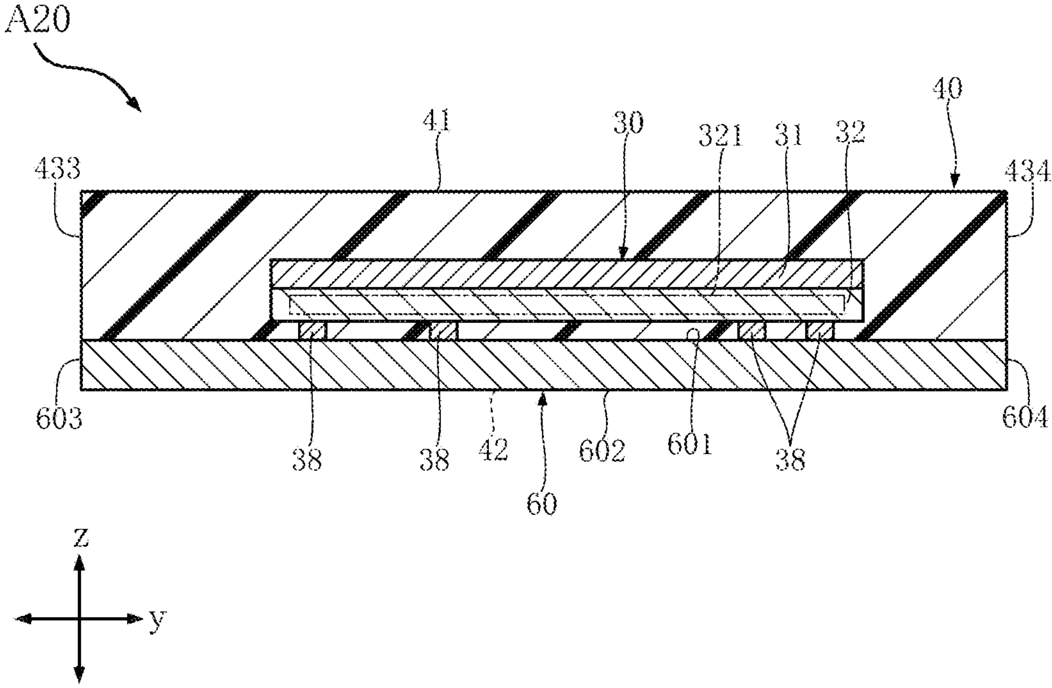
FIG. 25 is a sectional view taken along line XXV-XXV in FIG. 18.

As shown in FIG. 25, the sixth lead 60 has a sixth obverse surface 601, an eighth reverse surface 602, an eighth end surface 603 and a ninth end surface 604. The sixth obverse surface 601 faces the same side as the fifth obverse surfaces 501 of the fifth leads 50 in the thickness direction z and is opposite to the semiconductor element 30. The sixth obverse surface 601 is covered with the sealing resin 40. The semiconductor element 30 is supported on the sixth obverse surface 601.

The eighth reverse surface 602 faces away from the sixth obverse surface 601 (i.e., faces the second side in the thickness direction z). The eighth reverse surface 602 is exposed from the sealing resin 40. In the present embodiment, the sixth obverse surface 601 and the eighth reverse surface 602 extend throughout the length of the semiconductor device A20 in the second direction y. The eighth end surface 603 is connected to the sixth obverse surface 601 and the eighth reverse surface 602 and faces the first side in the second direction y. The ninth end surface 604 is connected to the sixth obverse surface 601 and the eighth reverse surface 602 and faces the second side in the second direction y. The ninth end surface 604 and the ninth end surface 604 are exposed from the sealing resin 40.

In the sixth lead 60, the sixth obverse surface 601, on which the semiconductor element 30 is supported, may be plated with silver. The eighth reverse surface 602, the eighth end surface 603 and the ninth end surface 604, which are exposed from the sealing resin 40, may be plated with tin, for example. Instead of tin plating, plating with nickel, palladium and gold may be performed in that order to form a laminate of metal-plating layers.

As shown in FIGS. 18 and 19, the pair of seventh leads 70 are disposed in the middle of the semiconductor device A20 in the second direction y. Each of the seventh leads 70 extends in the first direction x. One of the seventh leads 70 is located on the first side in the first direction x, and the other one of the seventh leads 70 is located on the second side in the first direction x. Each of the seventh leads 70 receives a power (voltage) to drive the control circuit 322 or an electric signal for transmission to the control circuit 322.

Figure 27:
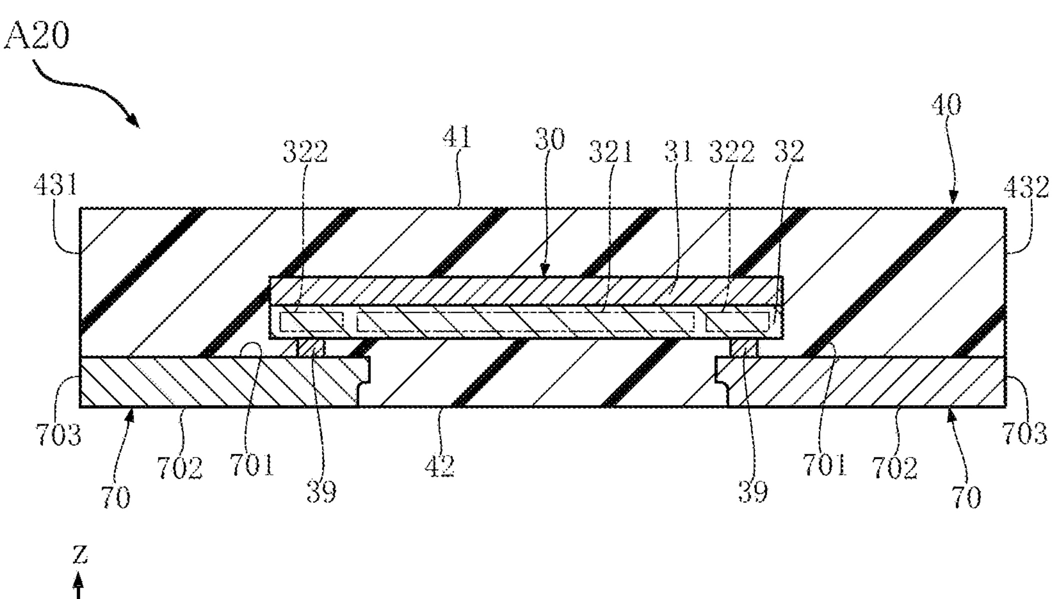
FIG. 27 is a sectional view taken along line XXVII-XXVII in FIG. 18.

As shown in FIG. 27, each of the seventh leads 70 has a seventh obverse surface 701, a ninth reverse surface 702 and a tenth end surface 703. The seventh obverse surface 701 faces the same side as the fifth obverse surfaces 501 of the fifth leads 50 in the thickness direction z and is opposite to the semiconductor element 30. The seventh obverse surface 701 is covered with the sealing resin 40. The semiconductor element 30 is supported on the seventh obverse surface 701.

The ninth reverse surface 702 faces away from the seventh obverse surface 701 (i.e., faces the second side in the thickness direction z). The ninth reverse surface 702 is exposed from the sealing resin 40. The tenth end surface 703 is connected to the seventh obverse surface 701 and the ninth reverse surface 702 and faces in the first direction x. Specifically, the tenth end surface 703 of one of the seventh leads 70 faces the first side in the first direction x, and the tenth end surface 703 of other one of the seventh leads 70 faces the second side in the first direction x. The tenth end surfaces 703 are exposed from the sealing resin 40.

In each of the pair of seventh leads 70, the seventh obverse surface 701, on which the semiconductor element 30 is supported, may be plated with silver, for example. The ninth reverse surface 702 and the tenth end surface 703, which are exposed from the sealing resin 40, may be plated with tin, for example. Instead of tin plating, plating with nickel, palladium and gold may be performed in that order to form a laminate of metal-plating layers.

Figure 28:
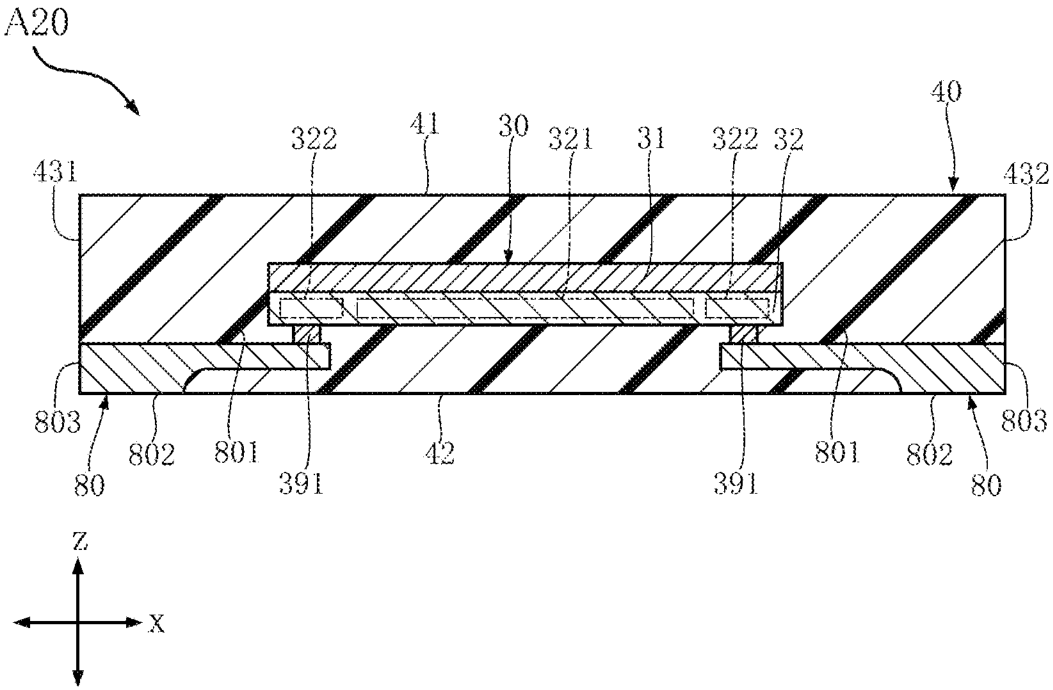
FIG. 28 is a sectional view taken along line XXVIII-XXVIII in FIG. 18.

As shown in FIGS. 18 and 19, the leads 80 are disposed on the first side and the second side in the first direction x and on the first side and the second side in the second direction y of the semiconductor device A20 (i.e., on the four sides of the semiconductor device A20 as viewed in the thickness direction z). Each of the leads 80 receives an electric signal for transmission to the control circuit 322. As shown in FIG. 28, each of the leads 80 has an obverse surface 801, a reverse surface 802 and an end surface 803. The obverse surface 801 faces the same side as the fifth obverse surfaces 501 of the fifth leads 50 in the thickness direction z and is opposite to the semiconductor element 30. The obverse surface 801 is covered with the sealing resin 40. The semiconductor element 30 is supported on the obverse surface 801. The reverse surface 808 faces away from the obverse surface 801 (i.e., faces the second side in the thickness direction z). The reverse surface 802 is exposed from the sealing resin 40. The end surface 803 is connected to the obverse surface 801 and the reverse surface 802 and faces one of the first side in the first direction x, the second side in first direction x, the first side in the second direction y and the second side in the second direction y. The end surface 803 is exposed from the sealing resin 40.

In each of the leads 80, the obverse surface 801, on which the semiconductor element 30 is supported, may be plated with silver, for example. The reverse surface 802 and the end surface 803, which are exposed from the sealing resin 40, may be plated with tin, for example. Instead of tin plating, plating with nickel, palladium and gold may be performed in that order to form a laminate of metal-plating layers.

As shown in FIGS. 24 to 28, the semiconductor element 30 is supported on the fifth leads 50, the lead 54, the sixth lead 60, the pair of seventh leads 70 and the leads 80. The semiconductor element 30 is covered with the sealing resin 40. The semiconductor element 30 has a semiconductor substrate 31, a semiconductor layer 32, a plurality of fifth electrodes 37, a plurality of electrodes 371, a plurality of sixth electrodes 38, a plurality of seventh electrodes 39 and a plurality of electrodes 391.

As shown in FIGS. 24 to 28, the semiconductor substrate 31 supports, below it, the semiconductor layer 32, the fifth electrodes 37, the electrodes 371, the sixth electrodes 38, the seventh electrodes 39 and the electrodes 391. The constituent material of the semiconductor substrate 31 may be Si (silicon) or silicon carbide (SiC), for example.

The semiconductor layer 32 is laminated on the semiconductor substrate 31 to face the fifth obverse surfaces 501 of the fifth leads 50 in the thickness direction z. The semiconductor layer 32 contains various kinds of p-type semiconductors and n-type semiconductors which differ in amount of doped elements. The switching circuit 321 and the control circuit 322 electrically connected to the switching circuit 321 are contained in the semiconductor layer 32. The switching circuit 321 may be a MOSFET (Metal-Oxide-Semiconductor Field-Effect Transistor) or an IGBT (Insulated Gate Bipolar Transistor), for example. In the example of the semiconductor device A20, the switching circuit 321 is divided into two regions, i.e., a high-voltage region (upper arm circuit) and a low-voltage region (lower arm circuit). Each region is constituted by a single n-channel MOSFET. The control circuit 322 contains e.g., a gate driver for driving the switching circuit 321 or a bootstrap circuit for the high-voltage region of the switching circuit 321 and is configured to control the switching circuit 321. The semiconductor layer 32 also contains a wiring layer (not shown). The wiring layer electrically connects the switching circuit 321 and the control circuit 322 to each other.

As shown in FIGS. 24 to 28, the fifth electrodes 37, the electrodes 371, the sixth electrodes 38, the seventh electrodes 39 and the electrodes 391 are provided to face the fifth obverse surfaces 501 of the fifth leads 50 in the thickness direction z. The fifth electrodes 37, the electrodes 371, the sixth electrodes 38, the seventh electrodes 39 and the electrodes 391 are held in contact with the semiconductor layer 32.

The fifth electrodes 37, the electrodes 371 and the sixth electrodes 38 are electrically connected to the switching circuit 321 of the semiconductor layer 32. The fifth electrodes 37 are connected to the fifth obverse surfaces 501 of the fifth leads 50. Thus, the fifth leads 50 are electrically connected to the switching circuit 321. As shown in the figures such as FIGS. 18 and 24, in the present embodiment, at least one fifth electrode 37 overlaps with each of the seventh terminal portions 52 (the seventh reverse surfaces 503) as viewed in the thickness direction z. The electrodes 371 are connected to the obverse surface 541 of the lead 54. Thus, the lead 54 is electrically connected to the switching circuit 321. The sixth electrodes 38 are connected to the sixth obverse surface 601 of the sixth lead 60. Thus, the sixth lead 60 is electrically connected to the switching circuit 321.

The seventh electrodes 39 are the electrodes 391 are electrically connected to the control circuit 322 of the semiconductor layer 32. The seventh electrodes 39 are connected to the seventh obverse surfaces 701 of the pair of seventh leads 70. The electrodes 391 are connected to the obverse surfaces 801 of the leads 80. Thus, the pair of seventh leads 70 and the leads 80 are electrically connected to the control circuit 322. The constituent material of the fifth electrodes 37, the electrodes 371, the sixth electrodes 38, the seventh electrodes 39 and the electrodes 391 may include copper, for example.

As shown in FIGS. 17 and 18, the semiconductor element 30 is rectangular as viewed in the thickness direction z. The element side surface 301 has a first element side surface 301, a second element side surface 302, a third element side surface 303 and a fourth element side surface 304. The first element side surface 301 and the second element side surface 302 are spaced apart from each other in the first direction x. The first element side surface 301 faces the first side in the first direction x. The second element side surface 302 faces the second side in the first direction x. Each of the third element side surface 303 and the fourth element side surface 304 is connected to the first element side surface 301 and the second element side surface 302. The third element side surface 303 and the fourth element side surface 304 are spaced apart from each other in the second direction y. The third element side surface 303 faces the first side in the second direction y. The fourth element side surface 304 faces the second side in the second direction y. In the present embodiment, the outer edges of the semiconductor substrate 31 and the semiconductor layer 32 as viewed in the thickness direction z define the first element side surface 301, the second element side surface 302, the third element side surface 303 and the fourth element side surface 304.

In the present embodiment, four divided regions Da can be defined as shown in FIG. 18 by dividing the region surrounded by the first element side surface 301, the second element side surface 302, the third element side surface 303 and the fourth element side surface 304 as viewed in the thickness direction z equally into two regions in each of the first direction x and the second direction y. In this state, at least one seventh reverse surface 503 is located in each of the four divided regions Da as viewed in the thickness direction z. At least one fifth electrode 37 overlaps with each seventh reverse surface 503 in each of the divided regions Da as viewed in the thickness direction z. Also, in the present embodiment, the four seventh reverse surfaces 503 included in the pair of fifth leads 50 on the first side in the second direction y and the pair of fifth leads 50 on the first side in the second direction y are located in different divided regions Da as viewed in the thickness direction.

With the four seventh reverse surfaces 503 disposed in the four divided regions Da, the sixth lead 60 is located, in the first direction x, between the pair of seventh reverse surfaces 503 located on the first side in the first direction x and the pair of seventh reverse surfaces 503 located on the second side in the first direction x.

Each of the four seventh reverse surfaces 503 disposed in the four divided regions Da extends in the second direction y. With the four seventh reverse surfaces 503 disposed in the four divided regions Da, the pair of seventh reverse surfaces 503 located on the first side in the first direction x overlap with each other as viewed in the second direction y, so do the pair of seventh reverse surfaces 503 located on the second side in the first direction x. Also, with the four seventh reverse surfaces 503 disposed in the four divided regions Da, the pair of seventh reverse surfaces 503 located on the first side in the second direction y overlap with each other as viewed in the first direction x, so do the pair of seventh reverse surfaces 503 located on the second side in the second direction y. In other words, the four seventh reverse surfaces 503 in the four divided regions Da are arranged symmetrically about a straight line (center line) extending parallel to the first direction x and also symmetrically about a straight line (center line) extending parallel to the second direction y.

As shown in FIGS. 20 to 23, the sealing resin 40 has a top surface 41, a bottom surface 42, a first side surface 431, a second side surface 432, a third side surface 433 and a fourth side surface 434. The constituent material of the sealing resin 40 may be black epoxy resin, for example.

As shown in FIGS. 24 to 28, the top surface 41 faces the same side as the fifth obverse surfaces 501 of the fifth lead 50 in the thickness direction z. As shown in FIGS. 20 to 23, the bottom surface 42 faces away from the top surface 41. As shown in FIGS. 19 and 24 to 28, the sixth reverse surfaces 502 and the seventh reverse surfaces 503 of the fifth leads 50, the reverse surfaces 542 and 543 of the lead 54, the eighth reverse surface 602 of the sixth lead 60, the ninth reverse surfaces 702 of the pair of seventh leads 70 and the reverse surfaces 802 of the leads 80 are exposed at the bottom surface 42.

Figure 22:
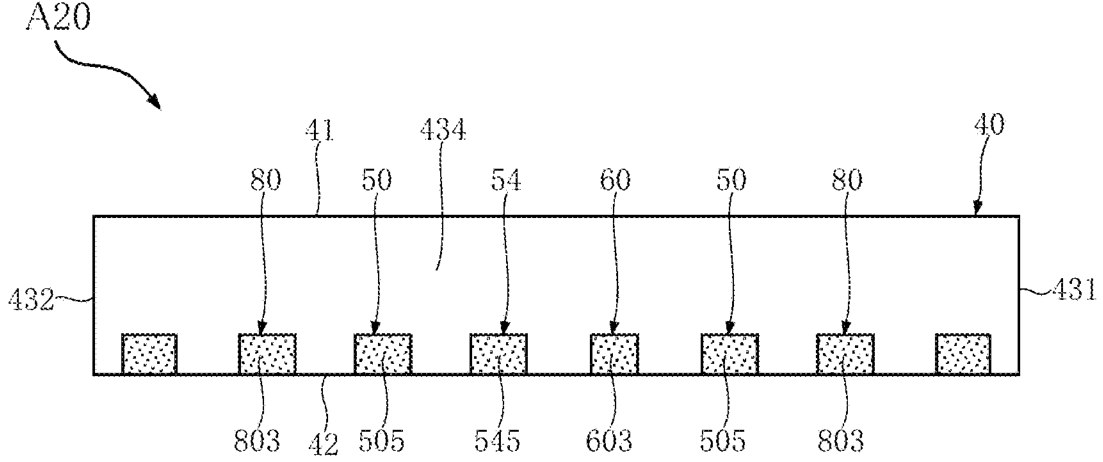
FIG. 22 is a right side view of the semiconductor device shown in FIG. 16.
Figure 22:
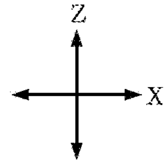
Figure 23:
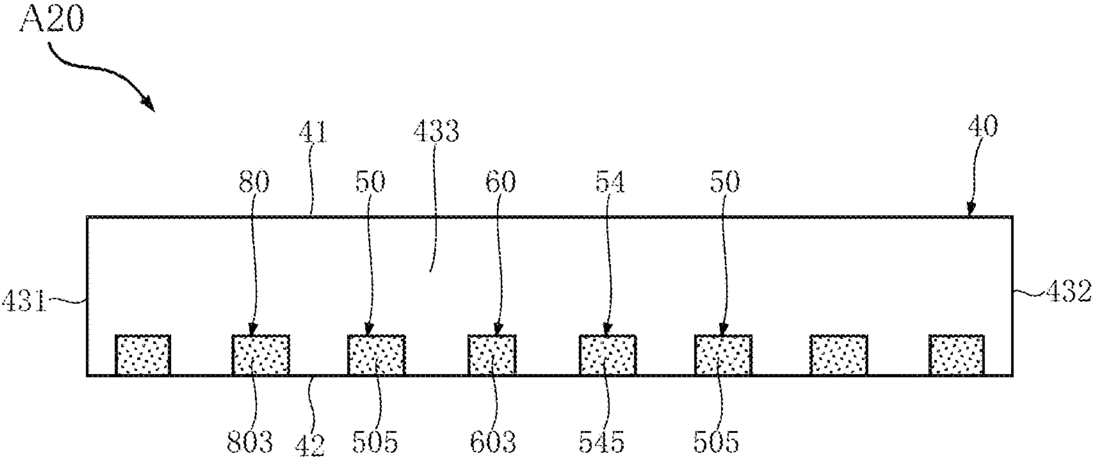
FIG. 23 is a left side view of the semiconductor device shown in FIG. 16.
Figure 23:
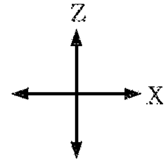

As shown in FIGS. 22 and 23, the first side surface 431 is connected to the top surface 41 and the bottom surface 42 and faces the first side in the first direction x. The second side surface 432 is connected to the top surface 41 and the bottom surface 42 and faces the second side in the first direction x. The first side surface 431 and the second side surface 432 are spaced apart from each other in the first direction x. As shown in FIGS. 27 and 28, the tenth end surface 703 of one of the seventh leads 70 and the end surfaces 803 of some of the leads 80 are exposed at the first side surface 431 to be flush with the first side surface 431. The tenth end surface 703 of the other seventh lead 70 and the end surfaces 803 of some of the leads 80 are exposed at the second side surface 432 to be flush with the second side surface 432.

Figure 20:
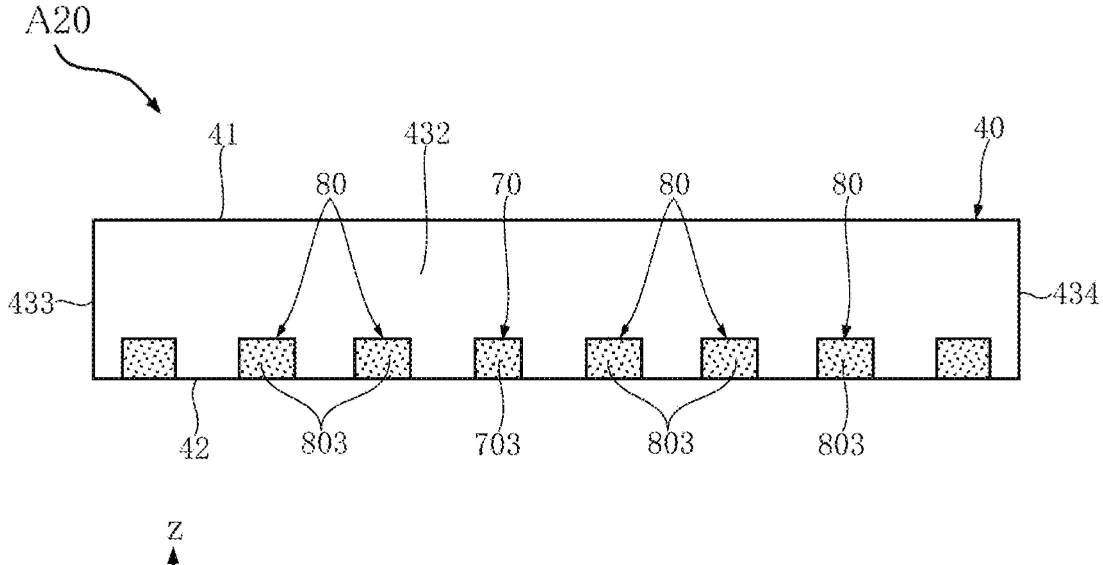
FIG. 20 is a front view of the semiconductor device shown in FIG. 16.
Figure 21:
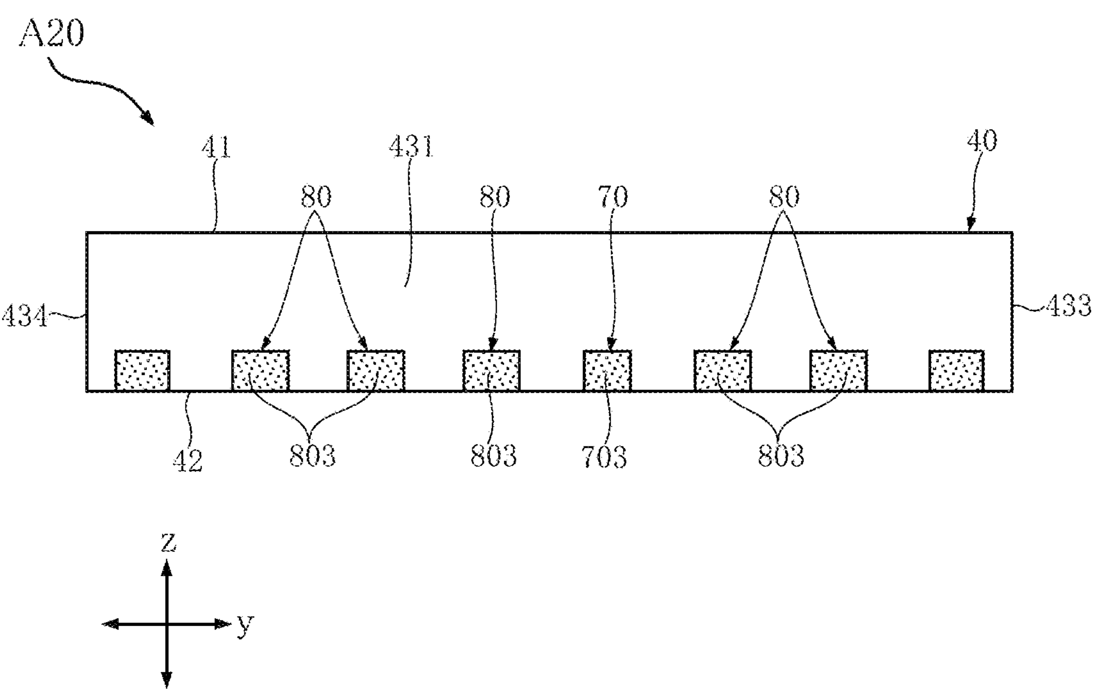
FIG. 21 is a rear view of the semiconductor device shown in FIG. 16.

As shown in FIGS. 20 and 21, the third side surface 433 is connected to the top surface 41, the bottom surface 42, the first side surface 431 and the second side surface 432 and faces the first side in the second direction y. The fourth side surface 434 is connected to the top surface 41, the bottom surface 42, the first side surface 431 and the second side surface 432 and faces the second side in the second direction y. The third side surface 433 and the fourth side surface 434 are spaced apart from each other in the second direction y. As shown in FIGS. 24 to 26, the seventh end surfaces 505 of some of the fifth leads 50, the end surface 545 of the lead 54 and the eighth end surface 603 of the sixth lead 60 are exposed at the third side surface 433 to be flush with the third side surface 433. The seventh end surfaces 505 of some of the fifth leads 50, the end surface 546 of the lead 54, and the ninth end surface 604 of the sixth lead 60 are exposed at the fourth side surface 434 to be flush with the fourth side surface 434.

The advantages of the present embodiment are described below.

The semiconductor device A20 includes the fifth leads 50, to which the fifth electrodes 37 are connected, and the sealing resin 40 that partially covers the fifth leads 50. Each of the fifth leads 50 has a sixth reverse surface 502, a seventh reverse surface 503 and a sixth recessed surface 504 that face away from the fifth obverse surface 501 in the thickness direction z. The sixth reverse surface 502 and the seventh reverse surface 503 are spaced apart from each other in the second direction y with the sixth recessed surface 504 between them and are exposed at the bottom surface 42 of the sealing resin 40. The sixth recessed surface 504 is covered with the sealing resin 40. The seventh end surface 505 is connected to the fifth obverse surface 501 and the sixth reverse surface 502 and exposed from the sealing resin 40 to be flush with the third side surface 433 or the fourth side surface 434 of the sealing resin 40. Each fifth lead 50 includes a sixth terminal portion 51 located at an end (the third side surface 433 or the fourth side surface 434) of the sealing resin 40 in the second direction y and having a sixth reverse surface 502, and a seventh terminal portion 52 located inward of the semiconductor device A20 from the sixth terminal portion 51 in the second direction y and having a seventh reverse surface 503. With such a configuration, the semiconductor element 30 is stably supported by the fifth leads 50, rather than being supported in a cantilevered manner by the fifth leads 50 via the fifth electrodes 37.

In the present embodiment, four divided regions Da can be defined by dividing the region surrounded by the first element side surface 301, the second element side surface 302, the third element side surface 303 and the fourth element side surface 304 of the semiconductor element 30 as viewed in the thickness direction z equally into two regions in each of the first direction x and the second direction y. In this case, at least one seventh reverse surface 503 is located in each of the four divided regions Da as viewed in the thickness direction z. That is, at least one seventh terminal portion 52 having a seventh reverse surface 503 is located in each of the divided regions Da. Thus, the semiconductor element 30 is supported stably in a balanced manner.

The seventh reverse surface 503 in each of the divided regions Da and at least one fifth electrode 37 overlap with each other as viewed in the thickness direction z. Thus, the semiconductor element 30 is directly supported on the seventh terminal portions 52 having seventh reverse surfaces 503 via the fifth electrodes 37. This also contributes to the stable supporting of the semiconductor element 30.

The semiconductor device A20 includes the sixth lead 60 which extends in the second direction y and to which the sixth electrodes 38 are connected. The sixth lead 60 has the sixth obverse surface 601, the eighth reverse surface 602, the eighth end surface 603 and the ninth end surface 604. The eighth end surface 603 is connected to the sixth obverse surface 601 and the eighth reverse surface 602 and faces the first side in the second direction y. The ninth end surface 604 is connected to the sixth obverse surface 601 and the eighth reverse surface 602 and faces the second side in the second direction y. The sixth obverse surface 601 and the eighth reverse surface 602 extend throughout the length of the semiconductor device A20 in the second direction y. Thus, the area of the eighth reverse surface 602 is relatively large, which leads to improved heat dissipation and mounting reliability of the semiconductor device A30.

The sixth lead 60 is located in the middle of the semiconductor device A20 in the first direction x. Specifically, with the four seventh reverse surfaces 503 disposed in the four divided regions Da, the sixth lead 60 is located, in the first direction x, between the pair of seventh reverse surfaces 503 located on the first side in the first direction x and the pair of seventh reverse surfaces 503 located on the second side in the first direction x. With such a configuration, the semiconductor element 30 is supported by the four fifth leads 50, which provide four seventh reverse surfaces 503 located in the four divided regions Da, and the sixth lead 60 located in the middle of the semiconductor device A20 in the first direction x. This also contributes to the stable supporting of the semiconductor element 30.

The semiconductor device A20 includes the pair of seventh leads 70 which extend in the first direction x and to which seventh electrodes 39 are connected. The seventh leads 70 are located in the middle of the semiconductor device A20 in the second direction y. One of the seventh leads 70 is located on the first side in the first direction x, and the other one of the seventh leads 70 is located on the second side in the first direction x. As shown in FIGS. 18 and 19, with the four seventh reverse surfaces 503 disposed in the four divided regions Da, the pair of seventh leads 70 are located, in the second direction y, between the pair of seventh reverse surfaces 503 located on the first side in the second direction y and the pair of seventh reverse surfaces 503 located on the second side in the second direction y. In this way, the four seventh reverse surfaces 503 (the seventh terminal portions 52), the sixth lead 60 and the pair of seventh leads 70 are arranged in a balanced manner. Thus, the semiconductor element 30 is supported more stably.

The semiconductor device according to the present disclosure is not limited to the foregoing embodiments. The specific configuration of each part of the semiconductor device according to the present disclosure can be varied in design in many ways.

The present disclosure includes the embodiments described in the following clauses.

Clause 1.

A semiconductor device comprising:

a plurality of first leads each including a first obverse surface facing a first side in a thickness direction and extending in a first direction orthogonal to the thickness direction;

a semiconductor element including a plurality of first electrodes connected to the first obverse surfaces of the plurality of first leads; and a sealing resin covering the plurality of first leads and the semiconductor element, wherein the sealing resin includes a resin bottom surface located on an opposite side of the semiconductor element with respect to the plurality of first leads in the thickness direction, the plurality of first leads are spaced apart from each other in a second direction orthogonal to the thickness direction and the first direction, and each of the plurality of first leads includes a first reverse surface, a second reverse surface and a first recessed surface that face away from the first obverse surface of the first lead in the thickness direction, the first reverse surface and the second reverse surface being spaced apart from each other with the first recessed surface therebetween in the first direction, the first reverse surface and the second reverse surface being exposed at the resin bottom surface, the first recessed surface being covered with the sealing resin.

Clause 2.

The semiconductor device according to clause 1, further comprising at least one second lead including a second obverse surface and extending in the first direction, wherein at least a part of the second lead is covered with the sealing resin, the semiconductor element includes a plurality of second electrodes connected to the second obverse surface, the second lead includes a third reverse surface, a second recessed surface and a third recessed surface that face away from the second obverse surface in the thickness direction, the third reverse surface is exposed at the resin bottom surface, and the second recessed surface and the third recessed surface are spaced apart from each other with the third reverse surface therebetween in the first direction and are covered with the sealing resin.

Clause 3.

The semiconductor device according to clause 2, wherein the plurality of first leads include two adjacent first leads that flank the second lead in the second direction.

Clause 4.

The semiconductor device according to clause 3, wherein the at least one second lead comprises a plurality of second leads spaced apart from each other in the second direction, and the plurality of first leads and the plurality of second leads are alternately arranged in the second direction.

Clause 5.

The semiconductor device according to clause 4, wherein each of the plurality of first leads includes a first terminal portion and a second terminal portion, the first terminal portion forming a part of the first obverse surface and the first reverse surface of the first lead, the second terminal portion forming a part of the first obverse surface and the second reverse surface of the first lead, and each of the plurality of second leads includes a third terminal portion that forms a part of the second obverse surface and the third reverse surface of the second lead.

Clause 6.

The semiconductor device according to clause 5, wherein the third terminal portion of each of the plurality of second leads does not overlap with either the first terminal portion or the second terminal portion of each of the plurality of first leads as viewed in the second direction.

Clause 7.

The semiconductor device according to clause 6, wherein at least one of the plurality of second electrodes overlaps with the third terminal portion of each of the plurality of second leads as viewed in the thickness direction.

Clause 8.

The semiconductor device according to clause 7, wherein each of the plurality of second leads includes a protruding portion that protrudes from the third terminal portion of the second lead in the second direction, the protruding portion forming a part the second obverse surface and a fourth recessed surface facing away from the second obverse surface of the second lead, the fourth recessed surface being covered with the sealing resin.

Clause 9.

The semiconductor device according to any one of clauses 6 to 8, wherein each of the plurality of first leads includes a first main portion forming a part of the first obverse surface and the first recessed surface of the first lead and overlapping with the first recessed surface as viewed in the thickness direction, and in each of the first leads, a dimension of each of the first terminal portion and the second terminal portion in the second direction is larger than a dimension of the first main portion in the second direction.

Clause 10.

The semiconductor device according to any one of clauses 4 to 9, wherein each of the plurality of first leads includes a first end surface and a second end surface, the first end surface being connected to the first obverse surface and the first reverse surface of the first lead and facing a first side in the first direction, the second end surface being connected to the first obverse surface and the second reverse surface and facing a second side in the first direction, each of the plurality of second leads includes a third end surface and a fourth end surface, the third end surface being connected to the second obverse surface and the second recessed surface of the second lead and facing the first side in the first direction, the fourth end surface being connected to the second obverse surface and the third recessed surface and facing the second side in the first direction, the sealing resin includes a first resin side surface and a second resin side surface that are connected to the resin bottom surface, spaced apart from each other in the first direction, and face the first side and the second side, respectively, in the first direction, and the first end surface and the third end surface are exposed at the first resin side surface to be flush with the first resin side surface, and the second end surface and the fourth end surface are exposed at the second resin side surface to be flush with the second resin side surface.

Clause 11.

The semiconductor device according to clause 10, further comprising a plurality of third leads each including a third obverse surface and a fourth reverse surface facing away from each other in the thickness direction and located on the first side of the plurality of first leads in the second direction, wherein at least a part of each of the plurality of third leads is covered with the sealing resin, and the semiconductor element includes a plurality of third electrodes, at least one of the plurality of third electrodes being connected to the third obverse surface of each of the plurality of third leads.

Clause 12.

The semiconductor device according to clause 11, wherein each of the plurality of third leads includes a fifth end surface connected to the third obverse surface and the fourth reverse surface of the third lead and facing the first side in the second direction, the sealing resin includes a third resin side surface and a fourth resin side surface that are connected to the resin bottom surface, the first resin side surface and the second resin side surface and spaced apart from each other in the second direction, the fourth reverse surface of each of the plurality of third leads is exposed at the resin bottom surface, and the fifth end surface of each of the plurality of third leads is exposed at the third resin side surface to be flush with the third resin side surface.

Clause 13.

The semiconductor device according to clause 12, further comprising a fourth lead including a fourth obverse surface and a fifth reverse surface facing away from each other in the thickness direction and located on the second side of the plurality of first leads in the second direction, wherein at least a part of the fourth lead is covered with the sealing resin, the fifth reverse surface is exposed at the resin bottom surface, and the semiconductor element includes a plurality of fourth electrodes connected to the fourth obverse surface.

Clause 14.

The semiconductor device according to clause 13, wherein the fourth lead includes a fourth main portion and a plurality of fourth terminal portions, the fourth main portion forming a part of the fourth obverse surface and a fifth recessed surface facing away from the fourth obverse surface and extending in the first direction, the plurality of fourth terminal portions being spaced apart from each other in the first direction, each of the plurality of fourth terminal portions protruding from the fourth main portion toward the second side in the second direction and forming a part of the fourth obverse surface and a part of the fifth reverse surface, the fifth recessed surface is covered with the sealing resin, each of the plurality of fourth terminal portions includes a sixth end surface connected to the fourth obverse surface and the fifth reverse surface and facing the second side in the second direction, and the sixth end surface of each of the plurality of fourth terminal portions is exposed at the fourth resin side surface to be flush with the fourth resin side surface.

Clause 15.

The semiconductor device according to clause 13 or 14, wherein the semiconductor element includes a semiconductor substrate and a semiconductor layer laminated on the semiconductor substrate, the semiconductor layer containing a switching circuit and a control circuit electrically connected to the switching circuit, and the plurality of first electrodes, the plurality of second electrodes, and the plurality of fourth electrodes are electrically connected to the switching circuit, and the plurality of third electrodes are electrically connected to the control circuit.

Clause 16.

The semiconductor device according to clause 15, wherein the plurality of first leads and the fourth lead are input terminals that receive DC power to be converted, and the plurality of second leads are output terminals that output AC power converted by the switching circuit.

Clause 17.

A semiconductor device comprising:

a plurality of fifth leads each including a fifth obverse surface facing in a thickness direction;

a semiconductor element including a plurality of fifth electrodes, the plurality of fifth electrodes being connected to the fifth obverse surfaces of the plurality of fifth leads; and a sealing resin covering the plurality of fifth leads and the semiconductor element, wherein the sealing resin includes a resin bottom surface located on an opposite side of the semiconductor element with respect to the plurality of fifth electrodes in the thickness direction, a first resin side surface and a second resin side surface connected to the resin bottom surface and spaced apart from each other in a first direction orthogonal to the thickness direction, and a third resin side surface and a fourth resin side surface spaced apart from each other in a second direction orthogonal to the thickness direction and the first direction, each of the plurality of fifth leads includes a sixth reverse surface, a seventh reverse surface and a sixth recessed surface that face away from the fifth obverse surface of the fifth lead in the thickness direction and a seventh end surface facing in the second direction, the sixth reverse surface and the seventh reverse surface being spaced apart from each other with the sixth recessed surface therebetween in the second direction, the sixth reverse surface and the seventh reverse surface being exposed at the resin bottom surface, the sixth recessed surface being covered with the sealing resin, the seventh end surface being connected to the fifth obverse surface and the sixth reverse surface and exposed from the sealing resin to be flush with the third resin side surface or the fourth resin side surface.

Clause 18.

The semiconductor device according to clause 17, wherein the semiconductor element includes a first element side surface and a second element side surface spaced apart from each other in the first direction and a third element side surface and a fourth element side surface spaced apart from each other in the second direction and connected to the first element side surface and the second element side surface, and when a region surrounded by the first element side surface, the second element side surface, the third element side surface and the fourth element side surface as viewed in the thickness direction is equally divided into two regions in each of the first direction and the second direction to define four divided regions, at least one of the seventh reverse surfaces of the plurality of fifth leads is located in each of the four divided regions.

Clause 19.

The semiconductor device according to clause 18, wherein the at least one seventh reverse surface located in each of the four divided regions overlaps with at least one of the plurality of fifth electrodes as viewed in the thickness direction.

Clause 20.

The semiconductor device according to clause 19, wherein the plurality of fifth leads include a first pair of fifth leads and a second pair of fifth leads, the seventh end surfaces of the first pair of fifth leads being flush with the third resin side surface, the seventh end surfaces of the second pair of fifth leads being flush with the fourth resin side surface, and each of the seventh reverse surfaces of the first pair and the second pair of fifth leads is located in a respective one of the four divided regions as viewed in the thickness direction.

Clause 21.

The semiconductor device according to clause 20, further comprising a sixth lead including a sixth obverse surface and an eighth reverse surface facing away from each other in the thickness direction and extending in the second direction, wherein a part of the sixth lead is covered with the sealing resin, the semiconductor element includes a plurality of sixth electrodes connected to the sixth obverse surface, the sixth lead includes an eighth end surface and a ninth end surface that are connected to the sixth obverse surface and the eighth reverse surface and face the first side and the second side, respectively, in the second direction, the eighth end surface is exposed at the third resin side surface to be flush with the third resin side surface, and the ninth end surface is exposed at the fourth resin side surface to be flush with the fourth resin side surface.

Clause 22.

The semiconductor device according to clause 21, wherein the seventh reverse surfaces each located in a respective one of the four divided regions are divided into a first pair of seventh reverse surfaces and a second pair of seventh reverse surfaces, the first pair of seventh reverse surfaces being spaced apart from the second pair of seventh reverse surfaces in the first direction, and the sixth lead is located between the first pair of seventh reverse surfaces and the second pair of seventh reverse surfaces in the first direction.

Clause 23.

The semiconductor device according to clause 21 or 22, wherein the seventh reverse surfaces each located in a respective one of the four divided regions extend in the second direction, and the seventh reverse surfaces each located in a respective one of the four divided regions are arranged symmetrically about a straight line extending parallel to the first direction and also symmetrically about a straight line extending parallel to the second direction.

Clause 24.

The semiconductor device according to clause 23, further comprising a pair of seventh leads each including a seventh obverse surface and a ninth reverse surface facing away from each other in the thickness direction and extending in the second direction, wherein the semiconductor element includes a plurality of seventh electrodes connected to the seventh obverse surfaces of the pair of seventh leads, a part of each of the pair of seventh lead is covered with the sealing resin, each of the pair of seventh leads includes a tenth end surface connected to the seventh obverse surface and the ninth reverse surface of the seventh lead and facing in the first direction, the tenth end surfaces of the pair of seventh leads face away from each other in the first direction, the seventh reverse surfaces each located in a respective one of the four divided regions are divided into a third pair of seventh reverse surfaces and a fourth pair of seventh reverse surfaces, the third pair of seventh reverse surfaces being spaced apart from the fourth pair of seventh reverse surfaces in the second direction, and the pair of seventh leads are located between the third pair of seventh reverse surfaces and the fourth pair of seventh reverse surfaces in the second direction.

Clause 25.

The semiconductor device according to clause 24, wherein the semiconductor element includes a semiconductor substrate and a semiconductor layer laminated on the semiconductor substrate in the thickness direction, the semiconductor layer contains a switching circuit and a control circuit electrically connected to the switching circuit, the plurality of fifth electrodes and the plurality of sixth electrodes are electrically connected to the switching circuit, and the plurality of seventh electrodes are electrically connected to the control circuit.

Clause 26.

The semiconductor device according to clause 25, wherein the sixth lead is an input terminal that receives DC power to be converted, and the plurality of fifth leads are output terminals that output AC power converted by the switching circuit.

REFERENCE NUMERALS

A10, A20: Semiconductor device 10: First lead
101: First obverse surface 102: First reverse surface
103: Second reverse surface 104: First recessed surface
105: First end surface 106: Second end surface
11: First terminal portion 12: Second terminal portion
13: First main portion 20: Second lead
201: Second obverse surface 202: Third reverse surface
203: Second recessed surface 204: Third recessed surface
205: Fourth recessed surface 206: Third end surface
207: Fourth end surface 21: Third terminal portion
22: Second main portion 23: Third main portion
24: Protruding portion 25: Third lead
251: Third obverse surface 252: Fourth reverse surface
253: Fifth end surface 26: Lead
261: Obverse surface 262: Reverse surface
263: End surface 27: Fourth lead
271: Fourth obverse surface 272: Fifth reverse surface
273: Fifth recessed surface 274: Sixth end surface
28: Fourth main portion 29: Fourth terminal portion
30: Semiconductor element 301: First element side surface
302: Second element side surface 303: Third element side surface
304: Fourth element side surface 31: Semiconductor substrate
32: Semiconductor layer 321: Switching circuit
322: Control circuit 33: First electrode
34: Second electrode 35: Third electrode
36: Fourth electrode 37: Fifth electrode
371: Electrode 38: Sixth electrode 39: Seventh electrode 391: Electrode
40: Sealing resin 41: Top surface
42: Bottom surface 431: First side surface
432: Second side surface 433: Third side surface
434: Fourth side surface 50: Fifth lead
501: Fifth obverse surface 502: Sixth reverse surface
503: Seventh reverse surface 504: Sixth recessed surface
505: Seventh end surface 51: Sixth terminal portion
52: Seventh terminal portion 53: Sixth main portion
54: Lead 541: Obverse surface
542: Reverse surface 543: Reverse surface
544: Recessed surface 545: End surface
546: End surface 60: Sixth lead
601: Sixth obverse surface 602: Eighth reverse surface
603: Eighth end surface 604: Ninth end surface
70: Seventh lead 701: Seventh obverse surface
702: Ninth reverse surface 703: Tenth end surface
80: Lead 801: Obverse surface
802: Reverse surface 803: End surface
Da: Divided region
L1: Dimension (the dimension of the first terminal portions in the second direction)
L2: Dimension (the dimension of the second terminal portions in the second direction)
L3: Dimension (the dimension of the first main portions in the second direction)
x: First direction y: Second direction z: Thickness direction

The invention claimed is:

1. A semiconductor device comprising:

a plurality of first leads each including a first obverse surface facing a first side in a thickness direction and extending in a first direction orthogonal to the thickness direction;

a semiconductor element including a plurality of first electrodes connected to the first obverse surfaces of the plurality of first leads; and a sealing resin covering the plurality of first leads and the semiconductor element, wherein the sealing resin includes a resin bottom surface located on an opposite side of the semiconductor element with respect to the plurality of first leads in the thickness direction, the plurality of first leads are spaced apart from each other in a second direction orthogonal to the thickness direction and the first direction, each of the plurality of first leads includes a first reverse surface, a second reverse surface and a first recessed surface that face away from the first obverse surface of the first lead in the thickness direction, the first reverse surface and the second reverse surface being spaced apart from each other with the first recessed surface therebetween in the first direction, the first reverse surface and the second reverse surface being exposed at the resin bottom surface, the first recessed surface being covered with the sealing resin, the semiconductor device further comprises at least one second lead including a second obverse surface and extending in the first direction, wherein at least a part of the second lead is covered with the sealing resin, the semiconductor element includes a plurality of second electrodes connected to the second obverse surface, the second lead includes a third reverse surface, a second recessed surface and a third recessed surface that face away from the second obverse surface in the thickness direction, the third reverse surface is exposed at the resin bottom surface, and the second recessed surface and the third recessed surface are spaced apart from each other with the third reverse surface therebetween in the first direction and are covered with the sealing resin.

2. The semiconductor device according to claim 1, wherein the plurality of first leads include two adjacent first leads that flank the second lead in the second direction.

3. The semiconductor device according to claim 2, wherein the at least one second lead comprises a plurality of second leads spaced apart from each other in the second direction, and the plurality of first leads and the plurality of second leads are alternately arranged in the second direction.

4. The semiconductor device according to claim 3, wherein each of the plurality of first leads includes a first terminal portion and a second terminal portion, the first terminal portion forming a part of the first obverse surface and the first reverse surface of the first lead, the second terminal portion forming a part of the first obverse surface and the second reverse surface of the first lead, and each of the plurality of second leads includes a third terminal portion that forms a part of the second obverse surface and the third reverse surface of the second lead.

5. The semiconductor device according to claim 4, wherein the third terminal portion of each of the plurality of second leads does not overlap with either the first terminal portion or the second terminal portion of each of the plurality of first leads as viewed in the second direction.

6. The semiconductor device according to claim 5, wherein at least one of the plurality of second electrodes overlaps with the third terminal portion of each of the plurality of second leads as viewed in the thickness direction.

7. The semiconductor device according to claim 6, wherein each of the plurality of second leads includes a protruding portion that protrudes from the third terminal portion of the second lead in the second direction, the protruding portion forming a part the second obverse surface and a fourth recessed surface facing away from the second obverse surface of the second lead, the fourth recessed surface being covered with the sealing resin.

8. The semiconductor device according to claim 5, wherein each of the plurality of first leads includes a first main portion forming a part of the first obverse surface and the first recessed surface of the first lead and overlapping with the first recessed surface as viewed in the thickness direction, and in each of the first leads, a dimension of each of the first terminal portion and the second terminal portion in the second direction is larger than a dimension of the first main portion in the second direction.

9. The semiconductor device according to claim 3, wherein each of the plurality of first leads includes a first end surface and a second end surface, the first end surface being connected to the first obverse surface and the first reverse surface of the first lead and facing a first side in the first direction, the second end surface being connected to the first obverse surface and the second reverse surface and facing a second side in the first direction, each of the plurality of second leads includes a third end surface and a fourth end surface, the third end surface being connected to the second obverse surface and the second recessed surface of the second lead and facing the first side in the first direction, the fourth end surface being connected to the second obverse surface and the third recessed surface and facing the second side in the first direction, the sealing resin includes a first resin side surface and a second resin side surface that are connected to the resin bottom surface, spaced apart from each other in the first direction, and face the first side and the second side, respectively, in the first direction, and the first end surface and the third end surface are exposed at the first resin side surface to be flush with the first resin side surface, and the second end surface and the fourth end surface are exposed at the second resin side surface to be flush with the second resin side surface.

10. The semiconductor device according to claim 9, further comprising a plurality of third leads each including a third obverse surface and a fourth reverse surface facing away from each other in the thickness direction and located on the first side of the plurality of first leads in the second direction, wherein at least a part of each of the plurality of third leads is covered with the sealing resin, and the semiconductor element includes a plurality of third electrodes, at least one of the plurality of third electrodes being connected to the third obverse surface of each of the plurality of third leads.

11. The semiconductor device according to claim 10, wherein each of the plurality of third leads includes a fifth end surface connected to the third obverse surface and the fourth reverse surface of the third lead and facing the first side in the second direction, the sealing resin includes a third resin side surface and a fourth resin side surface that are connected to the resin bottom surface, the first resin side surface and the second resin side surface and spaced apart from each other in the second direction, the fourth reverse surface of each of the plurality of third leads is exposed at the resin bottom surface, and the fifth end surface of each of the plurality of third leads is exposed at the third resin side surface to be flush with the third resin side surface.

12. The semiconductor device according to claim 11, further comprising a fourth lead including a fourth obverse surface and a fifth reverse surface facing away from each other in the thickness direction and located on the second side of the plurality of first leads in the second direction, wherein at least a part of the fourth lead is covered with the sealing resin, the fifth reverse surface is exposed at the resin bottom surface, and the semiconductor element includes a plurality of fourth electrodes connected to the fourth obverse surface.

13. The semiconductor device according to claim 12, wherein the fourth lead includes a fourth main portion and a plurality of fourth terminal portions, the fourth main portion forming a part of the fourth obverse surface and a fifth recessed surface facing away from the fourth obverse surface and extending in the first direction, the plurality of fourth terminal portions being spaced apart from each other in the first direction, each of the plurality of fourth terminal portions protruding from the fourth main portion toward the second side in the second direction and forming a part of the fourth obverse surface and a part of the fifth reverse surface, the fifth recessed surface is covered with the sealing resin, each of the plurality of fourth terminal portions includes a sixth end surface connected to the fourth obverse surface and the fifth reverse surface and facing the second side in the second direction, and the sixth end surface of each of the plurality of fourth terminal portions is exposed at the fourth resin side surface to be flush with the fourth resin side surface.

14. The semiconductor device according to claim 12, wherein the semiconductor element includes a semiconductor substrate and a semiconductor layer laminated on the semiconductor substrate, the semiconductor layer containing a switching circuit and a control circuit electrically connected to the switching circuit, and the plurality of first electrodes, the plurality of second electrodes, and the plurality of fourth electrodes are electrically connected to the switching circuit, and the plurality of third electrodes are electrically connected to the control circuit.

15. The semiconductor device according to claim 14, wherein the plurality of first leads and the fourth lead are input terminals that receive DC power to be converted, and the plurality of second leads are output terminals that output AC power converted by the switching circuit.

* * * * *